United States Patent [19]
McMillin et al.

[11] Patent Number: 6,013,155
[45] Date of Patent: Jan. 11, 2000

[54] GAS INJECTION SYSTEM FOR PLASMA PROCESSING

[75] Inventors: Brian McMillin, Fremont; Huong Nguyen, San Ramon; Michael Barnes, San Francisco; Tom Ni, Fremont, all of Calif.

[73] Assignee: LAM Research Corporation, Fremont, Calif.

[21] Appl. No.: 08/885,353

[22] Filed: Jun. 30, 1997

Related U.S. Application Data

[63] Continuation-in-part of application No. 08/672,315, Jun. 28, 1996.

[51] Int. Cl.$^7$ ...................................................... H05H 1/00
[52] U.S. Cl. .......................... 156/345; 118/723 I; 216/68; 427/569
[58] Field of Search .......................... 156/345; 118/723 I, 118/723 IR; 216/68; 427/569; 204/298.07, 298.33

[56] References Cited

U.S. PATENT DOCUMENTS

| | | |
|---|---|---|
| 4,173,661 | 11/1979 | Bourdon . |
| 4,270,999 | 6/1981 | Hassan et al. . |
| 4,512,283 | 4/1985 | Bonifield et al. . |
| 4,579,618 | 4/1986 | Celestino et al. . |
| 4,614,639 | 9/1986 | Hegedus . |
| 4,691,662 | 9/1987 | Roppel et al. . |
| 4,806,321 | 2/1989 | Nishizawa et al. . |
| 4,854,263 | 8/1989 | Chang et al. . |
| 4,877,641 | 10/1989 | Dory . |
| 4,913,929 | 4/1990 | Moslehi et al. . |
| 4,919,745 | 4/1990 | Fukuta et al. . |
| 4,943,345 | 7/1990 | Asmussen et al. . |
| 4,948,458 | 8/1990 | Ogle . |
| 4,980,204 | 12/1990 | Fujii et al. . |

(List continued on next page.)

FOREIGN PATENT DOCUMENTS

| | | |
|---|---|---|
| 0 503 820 | 9/1992 | European Pat. Off. . |
| 0520519 | 12/1992 | European Pat. Off. . |
| 0641013 | 1/1995 | European Pat. Off. . |
| 0637058 | 2/1995 | European Pat. Off. . |
| 0674336 | 9/1995 | European Pat. Off. . |
| 0676790 | 10/1995 | European Pat. Off. . |
| 0709875 | 5/1996 | European Pat. Off. . |
| 59-094811 | 5/1984 | Japan . |

OTHER PUBLICATIONS

"An Evaluation of Fluorine Doped Peteos on Gap Fill Ability and Film Characterization", by K. Hewes et al., Texas Instruments, Dallas, Texas (undated).

"Fundamentals, Etching, Deposition, and Surface Interactions", by Stephen M. Rossnagel et al., *Handbook of Plasma Processing Technology,* (1989), pp. 233–306.

(List continued on next page.)

*Primary Examiner*—Thi Dang
*Attorney, Agent, or Firm*—Burns, Doane, Swecker & Mathis, L.L.P.

[57] ABSTRACT

A plasma processing system for plasma processing of substrates such as semiconductor wafers. The system includes a plasma processing chamber, a substrate support for supporting a substrate within the processing chamber, a dielectric member having an interior surface facing the substrate support, the dielectric member forming a wall of the processing chamber, a gas supply comprising one or more injector tubes extending rectilinearly in the plasma processing chamber and having one or more orifices in a sidewall for supplying gas into the chamber, and an RF energy source such as a planar coil which inductively couples RF energy through the dielectric member and into the chamber to energize the process gas into a plasma state. The gas is supplied through orifices located outside of regions at the distal tip of the injector tubes where electric field lines are concentrated. The arrangement minimizes clogging of the orifices since the orifices are located away from areas where most build-up of process byproducts occur on the injector tube.

29 Claims, 14 Drawing Sheets

U.S. PATENT DOCUMENTS

| | | |
|---|---|---|
| 4,992,301 | 2/1991 | Shishiguchi et al. . |
| 4,996,077 | 2/1991 | Moslehi et al. . |
| 5,105,761 | 4/1992 | Charlet et al. . |
| 5,134,965 | 8/1992 | Tokuda et al. . |
| 5,164,040 | 11/1992 | Eres et al. . |
| 5,169,509 | 12/1992 | Latz et al. . |
| 5,192,370 | 3/1993 | Oda et al. . |
| 5,231,334 | 7/1993 | Paranjpe . |
| 5,252,133 | 10/1993 | Miyazaki et al. . |
| 5,262,029 | 11/1993 | Erskine et al. . |
| 5,267,607 | 12/1993 | Wada . |
| 5,279,865 | 1/1994 | Chebi et al. . |
| 5,280,154 | 1/1994 | Cuomo et al. . |
| 5,290,993 | 3/1994 | Kaji et al. . |
| 5,346,578 | 9/1994 | Benzing et al. . |
| 5,368,710 | 11/1994 | Chen et al. . |
| 5,384,008 | 1/1995 | Sinha et al. . |
| 5,399,387 | 3/1995 | Law et al. . |
| 5,401,350 | 3/1995 | Patrick et al. . |
| 5,405,480 | 4/1995 | Benzing et al. . |
| 5,415,728 | 5/1995 | Hasegawa et al. . |
| 5,498,313 | 3/1996 | Bailey et al. . |
| 5,522,934 | 6/1996 | Suzuki et al. . |
| 5,522,936 | 6/1996 | Tamura . |
| 5,525,159 | 6/1996 | Hama et al. . |
| 5,529,657 | 6/1996 | Ishii . |
| 5,531,834 | 7/1996 | Ishizuka et al. . |
| 5,552,124 | 9/1996 | Su . |
| 5,556,521 | 9/1996 | Ghanbari . |
| 5,591,268 | 1/1997 | Usui et al. . |
| 5,614,055 | 3/1997 | Fairbairn et al. . |
| 5,653,806 | 8/1997 | Van Buskirk . |

OTHER PUBLICATIONS

"Electron cyclotron resonance microwave discharges for etching and thin–film deposition", by Jes Asmussen, *J. Vac. Sci. Technol. A.,* vol. 7, No. 3, (May/Jun. 1989), pp. 883–893.

"Silicon Dioxide Films Produced by PECVD of TEOS and TMCTS", by D. Webb et al., *10439 Proceedings of the Int. Symp. on Ultra Large Scale Integration Science and Technology,* (1989), No. 9, Pennington, NJ, pp. 571–585.

"Low–temperature deposition of silicon dioxide films from electron cyclotron resonant microwave plasmas", by T.V. Herak et al., *J. Appl. Phys.,* 65(6), (Mar. 15, 1989), pp. 2457–2463.

"Reactive ion etching technology in thin–film–transistor processing", by Y. Kuo, *IBM J. Res. Develop.,* vol. 36, No. 1, (Jan. 1992), pp. 69–75.

"Preparation of SiOF Films with Low Dielectric Constant by ECR Plasma Chemical Vapor Deposition", by T. Fukada et al., *Extended Abstracts of the 1995 International Conference on Solid State Devices and Materials,* (1993), pp. 158–160.

"New approach to low temperature deposition of high–quality thin films by electron cyclotron resonance microwave plasmas", by T.T. Chau et al., *J. Vac. Sci. Technol. B.,* vol. 10(5) (Sep./Oct. 1992), pp. 2170–2178.

"Silicon dioxide trench filling process in a radio–frequency hollow cathode reactor", by M. Gross et al., *J. Vac. Sci. Technol. B.,* vol. 11(2), (Mar./Apr. 1993), pp. 242–248.

"Biased Electron Cyclotron Resonance Chemical–Vapor Deposition of Silicon Dioxide Inter–Metal Dielectric Thin Films", by P. Shufflebotham et al., *Materials Science Forum,* Switzerland, vol. 140–142, (1993) pp. 255–268.

"Preparation of SiOF Films with Low Dielectric Constant by ECR Plasma Chemical Vapor Deposition", by T. Fukada et al., *Extended Abst. of the 1993 Intern. Conf. on Solid State Devices and Materials,* (Feb. 21–22, 1995), pp. 43–49.

"High Density Plasma Deposition and Deep Submicron Gap Fill with Low Dielectric Constant SiOF Films", by L.Q. Qian et al., *DUMIC Conference,* (Feb. 21–22, 1995), 1995 ISMIC—101D/95/0050, pp. 50–56.

"Dual Frequency Plasma CVD Fluorosilicate Glass Water Absorption and Stability", by M.J. Shapiro et al.*DUMIC Conference,* (Feb. 21–22, 1995), 1994 ISMIC–101D/95/118, pp. 118–123.

"Comparison of PECVD F–TEOS Films and High Density Plasma SiOF Films", by D.C. Schuchmann et al., *VMIC Conference,* (Jun. 27–29, 1995), 1995 ISMIC–104/95/0097, pp. 97–103.

"Water–absorption mechanisms of F–doped PECVD $SiO_2$ with low–dielectric constant", by H. Miyajima et al., *VMIC Conference,* (Jun. 27–29, 1995), 1995 ISMIC–104/95/0391, pp. 391–393.

"Controlling Fluorine Concentration and Thermal Annealing Effect on Liquid–Phase Deposited $SiO_{2-x}F_x$ Films", by C.F. Yeh, *J. of Electrochem. Soc.,* vol. 142, No. 10, (Oct. 1995), pp. 3579–3583.

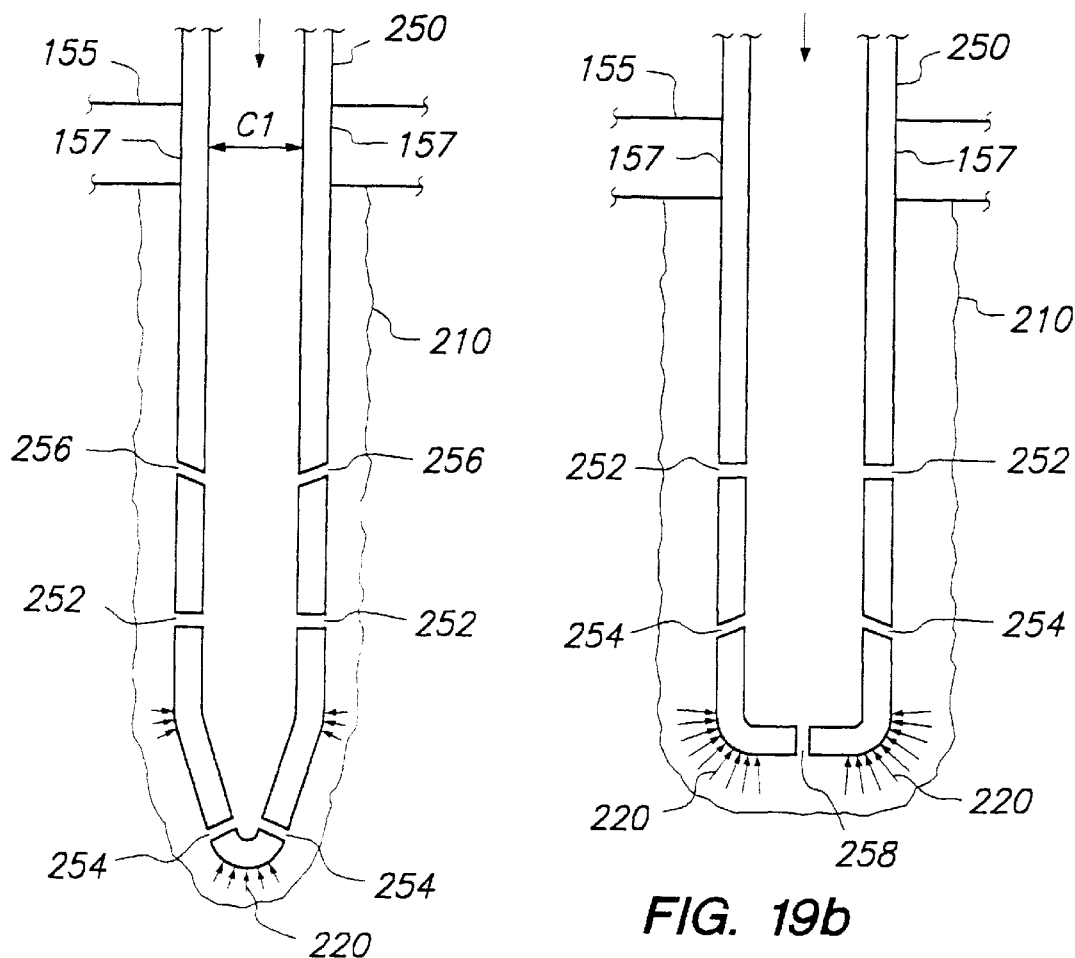
FIG. 19a
FIG. 19b
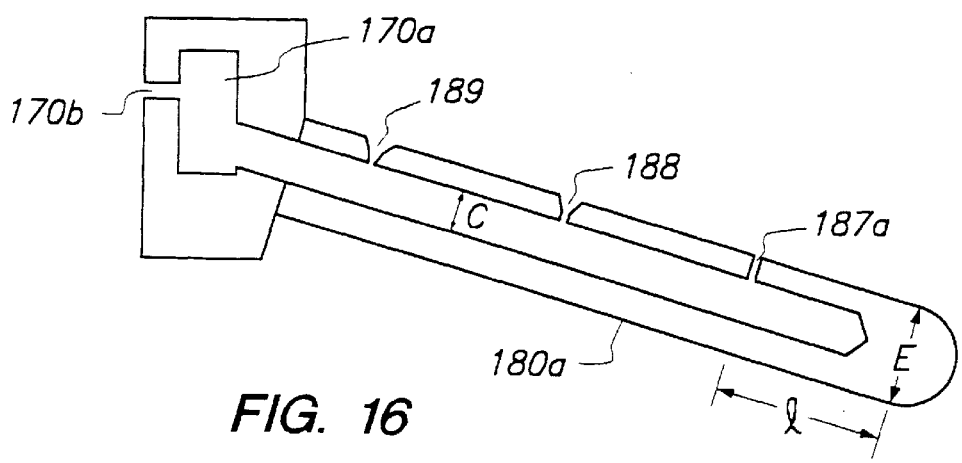
FIG. 16

GAS INJECTION SYSTEM FOR PLASMA PROCESSING

CROSS-REFERENCE TO RELATED APPLICATION

The present application is a Continuation-In-Part Application of U.S. patent application Ser. No. 08/672,315, filed on Jun. 28, 1996. The present application is related to U.S. patent application Ser. No. 08/772,374, filed on Dec. 23, 1996, and herein incorporated by reference.

FIELD OF THE INVENTION

The present invention relates to a system and a method for delivering reactants to a substrate in a plasma processing system. More particularly, the present invention relates to a system and a method for delivering reactants via a gas injection system to maximize processing uniformity.

BACKGROUND OF THE INVENTION

Vacuum processing chambers are generally used for chemical vapor depositing (CVD) of materials on substrates by supplying process gas to the vacuum chamber and applying a radio frequency (RF) field to the gas. A number of gas distribution systems for integrated circuit processing are known, but the vast majority of known systems are designed for low-density, high pressure plasma etching or for plasma enhanced CVD (PECVD). Conventional gas distribution systems typically deliver reactants at relatively low flow rates. Showerhead gas injection and diffusive transport systems are commonly used to ensure even distribution over the substrate.

These known systems are not optimized for high density plasma CVD (HDPCVD) processes, such as encapsulation and intermetal dielectric gap filling. In HDPCVD it is important to focus the delivery of reactants such as silane related species onto a substrate, because silane and its fragments, e.g., $SiH_3$, $SiH_2$, $SiH$, and so on, have high sticking coefficients. Directing the silane preferentially onto the substrate is advantageous because it maximizes the substrate deposition rate and minimizes film deposits on various internal surfaces of the reactor.

There are various known systems for increasing the concentration of process gas above the substrate surface. For example, FIG. 1 shows a system including a plasma source 110 for generating a plasma in a chamber 140 and a gas ring 167 with attached gas inlets supplying process gas into the processing chamber 140 for processing a substrate 120 on a substrate support 130. Gas is supplied to the plenum 167a of gas ring 167 via a gas delivery port 167b from a gas source (not shown). This type of system may also include an additional gas ring 160. Gas is supplied to the plenum 160a of the gas ring 160 through a gas delivery port (not shown). Conventionally, the deposition rate in such a system is increased by concentrating the process gas above the substrate 120. This is typically done by changing the distance from the gas ring 167 to the substrate 120. The more the process gas is concentrated toward the area above the center of the substrate, the larger the peak deposition rate. Unfortunately, in concentrating the process gas near the center of the substrate, the deposition rate on the outer portion of the substrate may not increase as much as the center, which leads to a potential decrease in deposition uniformity.

U.S. Pat. No. 4,691,662 to Roppel et al. discloses a dual plasma microwave apparatus for etching and deposition in which process gas is fed by conduits mounted on a side wall of a processing chamber, extending over a portion of the substrate. U.S. Pat. No. 5,522,934 to Suzuki et al. discloses a gas injector arrangement including a plurality of gas supply nozzles positioned in a plurality of levels in a direction substantially perpendicular to the substrate. The gas supply nozzles at upper levels extend further toward the center of the substrate than those at lower levels. The injection holes are located at the distal ends of the gas supply nozzles. These systems are effective in delivering the process gas to the region above the substrate. However, because the conduits extend over the substrate surface between the substrate and the primary ion generation region, as the ions diffuse from the generation region toward the substrate the conduits can cast shadows of ion nonuniformity onto the substrate surface. This can lead to an undesirable loss in etch and deposition uniformity.

Other approaches employ gas supply conduits which do not extend over the substrate surface. "Electron Cyclotron Resonance Microwave Discharges for Etching and Thin-film Deposition," J. Vacuum Science and Technology A, Vol. 7, pp. 883–893 (1989) by J. Asmussen shows conduits extending only up to the substrate edge. "Low-temperature Deposition of Silicon Dioxide Films from Electron Cyclotron Resonant Microwave Plasmas," J. Applied Physics, Vol. 65, pp. 2457–2463 (1989) by T. V. Herak et al. illustrates a plasma CVD tool including a plurality of gas injection conduits which feed separate process gases. One set of conduits is mounted in the lower chamber wall with gas delivery orifices located just outside the periphery of the substrate support and at the distal ends of the conduits. "New Approach to Low Temperature Deposition of High-quality Thin Films by Electron Cyclotron Resonance Microwave Plasmas," J. Vac. Sci. Tech, B, Vol. 10, pp. 2170–2178 (1992) by T. T. Chau et al. illustrates a plasma CVD tool including a gas inlet conduit mounted in the lower chamber wall, located just above and outside the periphery of the substrate support. The conduit is bent so that the injection axis is substantially parallel to the substrate. An additional horizontal conduit is provided for a second process gas. The gas injection orifices are located at the distal ends of the conduits. A problem with all of these gas injection plasma processing devices is that gas is injected from the distal ends of the conduits. Injectors with the orifices located at the distal ends of the injector tubes may be prone to clogging after processing a relatively small batch of substrates, e.g., less than 100. This injector orifice clogging is detrimental as it can lead to nonuniform distribution of reactants, nonuniform film deposition or etching of the substrate, and shifts in the overall deposition or etch rate.

Various systems have been proposed to improve process uniformity by injecting process gas at sonic or supersonic velocity. For example, U.S. Pat. No. 4,270,999 to Hassan et al. discloses the advantage of injecting process gases for plasma etch and deposition applications at sonic velocity. Hassan et al. notes that the attainment of sonic velocity in the nozzle promotes an explosive discharge from the vacuum terminus of the nozzle which engenders a highly swirled and uniform dissipation of gas molecules in the reaction zone surrounding the substrate. U.S. Pat. No. 5,614,055 to Fairbairn et al. discloses elongated supersonic spray nozzles which spray reactant gas at supersonic velocity toward the region overlying the substrate. The nozzles extend from the chamber wall toward the substrate, with each nozzle tip having a gas distribution orifice at the distal end. U.S. Pat. No. 4,943,345 to Asmussen et al. discloses a plasma CVD apparatus including supersonic nozzles for directing excited gas at the substrate. U.S. Pat. No. 5,164,040 to Eres et al. discloses pulsed supersonic jets for CVD. While these systems are intended to improve process uniformity, they suffer from the drawbacks noted above, namely clogging of the orifices at the distal ends of the injectors, which can adversely affect film uniformity on the substrate.

U.S. Pat. No. 4,996,077 to Moslehi et al. discloses an electron cyclotron resonance (ECR) device including gas injectors arranged around the periphery of a substrate to provide uniform distribution of non-plasma gases. The non-plasma gases are injected to reduce particle contamination, and the injectors are oriented to direct the non-plasma gas onto the substrate surface to be processed.

U.S. Pat. No. 5,252,133 to Miyazaki et al. discloses a multi-wafer non-plasma CVD apparatus including a vertical gas supply tube having a plurality of gas injection holes along a longitudinal axis. The injection holes extend along the longitudinal side of a wafer boat supporting a plurality of substrates to introduce gas into the chamber. Similarly, U.S. Pat. No. 4,992,301 to Shishiguchi et al. discloses a plurality of vertical gas supply tubes with gas emission holes along the length of the tube. These patents relate to thermal, non-plasma CVD, and are thus not optimized for plasma processing.

As substrate size increases, center gas injection is becoming increasingly important for ensuring uniform etching and deposition. This is particularly evident in flat panel display processing. Typically, diffusive transport is dominant in the region above the substrate in these low pressure processing systems, while convective transport plays much less of a role. Near the injection orifices, however, convective transport can dominate diffusive transport because of the jet-like nature of the injected gas. Locating the injection orifices closer to the substrate therefore increases the convective transport in relation to the otherwise dominant diffusive transport above the substrate. Conventional showerhead gas injection systems can deliver gases to the center of the substrate, but in order to locate the orifices close to the substrate, the chamber height must be reduced which can lead to an undesirable loss in ion uniformity.

Radial gas injection systems may not provide adequate process gas delivery to the center of large area substrates typically encountered, for example, in flat panel processing. This is particularly true in bottom-pumped chamber designs commonly found in plasma processing systems. Without a means for center gas feed, etch byproducts may stagnate above the center of the substrate, which can lead to undesirable nonuniform etching and profile control across the substrate.

The above-mentioned Fairbairn et al. patent also discloses a showerhead injection system in which injector orifices are located on the ceiling of the reactor. This showerhead system further includes a plurality of embedded magnets to reduce orifice clogging. U.S. Pat. No. 5,134,965 to Tokuda et al. discloses a processing system in which process gas is injected through inlets on the ceiling of a processing chamber. The gas is supplied toward a high density plasma region. This system employs microwave energy and is not optimized for radio frequency plasma processing. U.S. Pat. No. 5,522,934 to Suzuki et al. disclose a system where inert (rather than process) gas is injected through the center of the chamber ceiling.

There is thus a need for optimizing uniformity and deposition for radio frequency plasma processing of a substrate while preventing clogging of the gas supply orifices and build up of processing by-products and improving convective transport above the wafer.

SUMMARY OF THE INVENTION

It is an object of the present invention to provide a gas distribution system for HDPCVD which provides uniform, high flow rate delivery of reactant gases focused preferentially onto the substrate surface, to both maximize deposition rate on the substrate and to minimize the chamber cleaning requirements. It is another object of the present invention to thermally control the gas injection hardware to reduce particle counts within the chamber by minimizing flaking from internal chamber surfaces and by minimizing particle formation caused by thermal pyrolysis within the injection hardware. It is yet another object to provide a gas distribution system for etching and deposition of films uniformly on large area substrates during plasma processing of semiconductor wafers and flat panel displays. It is yet another object of the present invention to provide a gas distribution system which provides uniform, high flow rate delivery of reactive intermediate gases to a substrate surface for uniform etching and deposition across the substrate surface.

According to the present invention, a plasma processing system and method are provided for processing a substrate. The plasma processing system includes a plasma processing chamber, a substrate support for supporting a substrate within the processing chamber, a dielectric member having an interior surface facing the substrate support, the dielectric member forming a wall of the processing chamber, a gas supply for supplying process gas (e.g., one or more reactant gases and/or one or more inert gases) into the chamber and towards the substrate, and an RF energy source which inductively couples RF energy through the dielectric member and into the chamber to energize the process gas into a plasma state.

According to one aspect of the present invention, the gas supply may include one or more gas rings with or without injector tubes injecting at least some of the process gas into the processing chamber so as to intersect an exposed surface of the substrate. A cooling mechanism may also be provided to cool the gas supply during processing to minimize film flaking from the gas ring surfaces and prevent excessive heating which could lead to unwanted thermal decomposition of the process gas.

According to another aspect of the invention, the process gas is supplied from one or more orifices located along a sidewall of an elongated injector tube having a distal end thereof extending in the processing chamber. The gas is preferably supplied through one or more orifices located outside of regions where electric field lines are concentrated. At least some of the gas is preferably injected toward a primary ion generation zone. Substrates may be consecutively processed in the processing chamber by contacting the substrates with plasma gas.

BRIEF DESCRIPTION OF THE DRAWINGS

FIG. 16 illustrates in detail an exemplary injector according to the second aspect of the present invention;

FIGS. 19a–19b illustrate exemplary showerhead nozzles according to the second aspect of the present invention.

DETAILED DESCRIPTION OF THE PREFERRED EMBODIMENTS

The present invention provides an improved gas injection system for plasma processing of substrates such as by etching or CVD. The injection system can be used to inject gases such as gases containing silicon, halogen (e.g., F, Cl, Br, etc.), oxygen, hydrogen, nitrogen, etc. The injection system can be used alone or in addition to other reactant/inert gas supply arrangements.

According to one embodiment of the invention, an injector tube arrangement is provided wherein outlets in the injector tubes are located a distance away from a closed distal end of the injector such that clogging of the outlets can be avoided. In particular, the outlets are located in a region of reduced electric field strength at which there is reduced plasma induced reactant decomposition. That is, due to the presence of a thin (e.g., <1 mm) plasma sheath surrounding the distal end of the injector tubes, electric field lines (created by the difference in potential between the plasma and grounded injector tubes) can be quite large, especially at the distal tip of the injector tubes. In the sheath which forms around the entire plasma wetted portion of the injector tube, the electric field lines are perpendicular to the sheath at all locations and are concentrated at the distal tip. This locally enhanced electric field leads to locally enhanced deposition during etching or deposition which ultimately can clog outlets located in such regions. According to the invention, the injector tube outlets are located beyond the enhanced electric field so as to reduce susceptibility to clogging, particularly during successive plasma processing of individual substrates such as semiconductor wafers.

Figure 1:
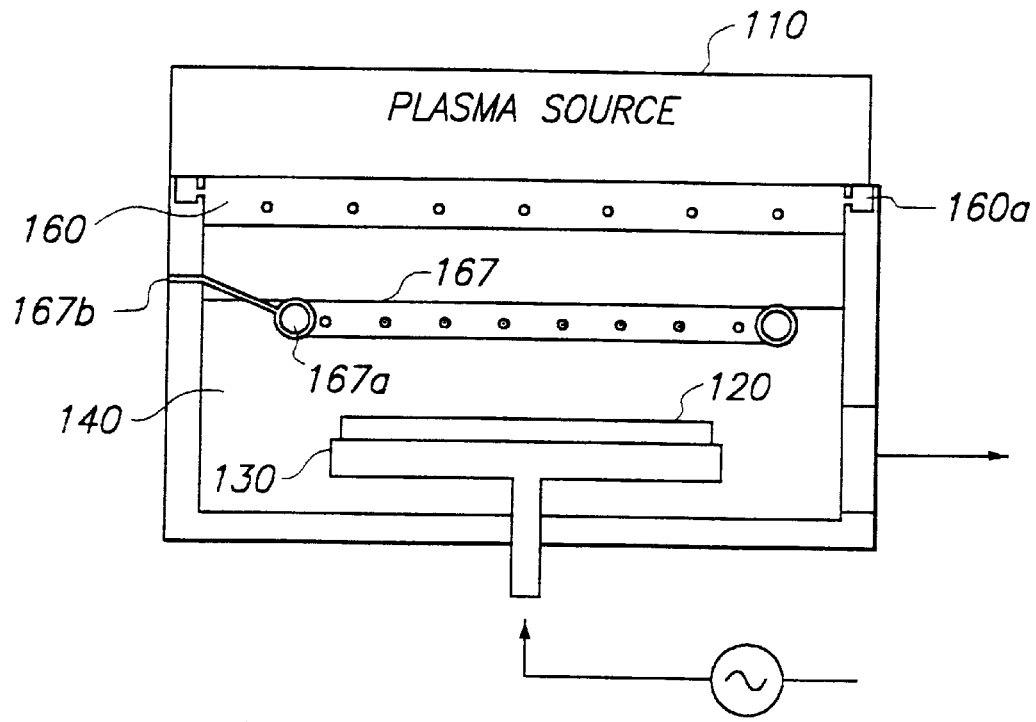
FIG. 1 illustrates a conventional plasma processing system.
Figure 2A:
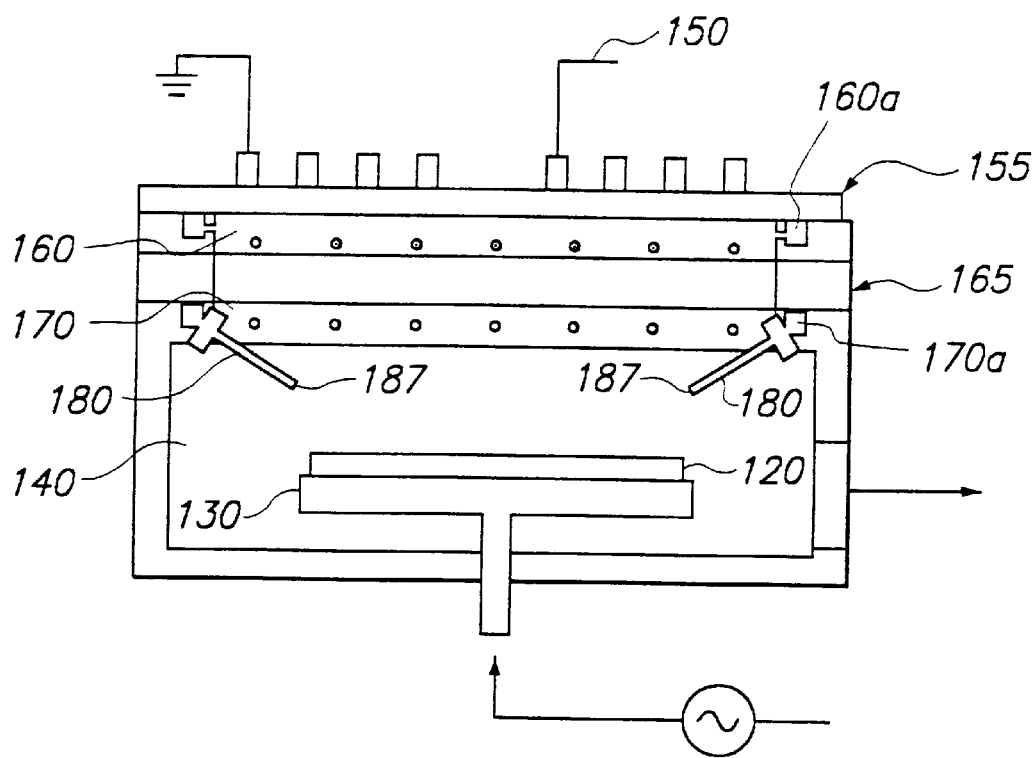
FIGS. 2a and 2b illustrate a plasma processing system according to an exemplary embodiment of a first aspect of the present invention.
Figure 2B:
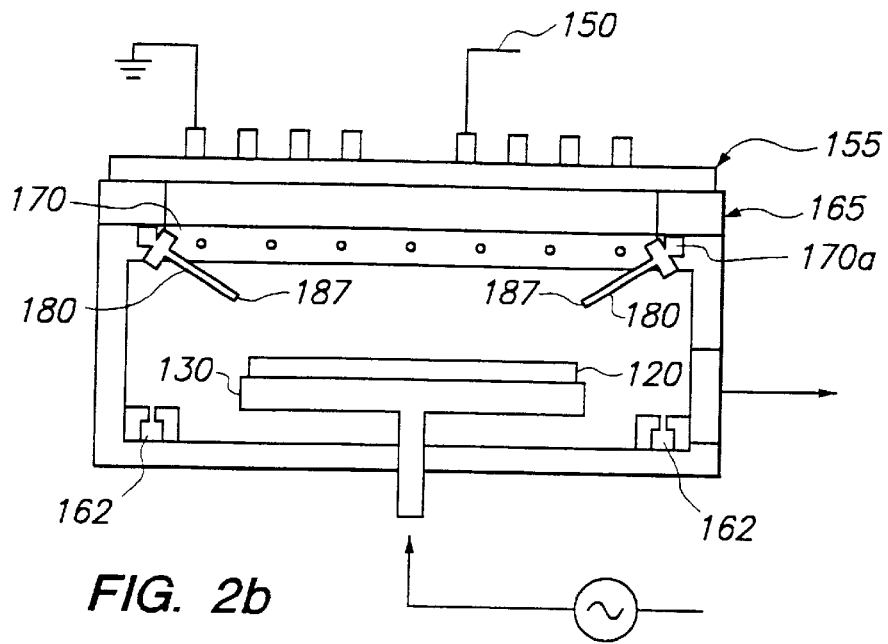

FIGS. 2a and 2b illustrate a plasma processing system according to an exemplary embodiment of a first aspect of the present invention. Referring to FIGS. 2a and 2b, a plasma processing system for processing a substrate 120 comprises a substrate support 130 and a processing chamber 140 enclosing the substrate support. The substrate 120 may be, for example, a semiconductor wafer having diameters such as 4", 6", 8", 12", etc., a glass substrate for making a flat panel display, and so on. The substrate support 130 may comprise, for example, a radio frequency (RF) powered electrode. The substrate support 130 may be supported from a lower endwall of the chamber 140 or may be cantilevered, e.g., extending from a sidewall of the chamber 140. The substrate 120 may be clamped to the electrode 130 either mechanically or electrostatically. The processing chamber 140 may, for example, be a vacuum chamber.

A substrate to be processed is inserted into the processing chamber 140. The substrate is processed in the processing chamber by energizing a process gas in the processing chamber into a high density plasma. A source of energy maintains a high density (e.g., $10^{11}$–$10^{12}$ ions/cm$^3$) plasma in the chamber. For example, an antenna 150, such as the planar multiturn spiral coil shown in FIGS. 2a and 2b, a non-planar multiturn coil, or an antenna having another shape, powered by a suitable RF source and suitable RF impedance matching circuitry inductively couples RF energy into the chamber to generate a high density plasma. However, the plasma can be generated by other sources such as ECR, parallel plate, helicon, helical resonator, etc., type sources. The chamber may include a suitable vacuum pumping apparatus for maintaining the interior of the chamber at a desired pressure (e.g., below 5 Torr, preferably 1–100 mTorr). A dielectric window, such as the planar dielectric window 155 of uniform thickness shown in FIGS. 2a and 2b, a non-planar dielectric window or a dielectric member in the form of a showerhead, a gas distribution plate, etc., is provided between the antenna 150 and the interior of the processing chamber 140 and forms the vacuum wall at the top of the processing chamber 140.

A gas supply supplying process gas into the chamber includes a primary gas ring 170 below the dielectric window 155. The gas ring 170 may be mechanically attached to the chamber housing above the substrate. The gas ring 170 may be made of, for example, aluminum or anodized aluminum.

The gas supply includes a secondary gas ring 160 below the dielectric window 155. The process gas can include one or more gases such as Ar and $O_2$ delivered into the chamber 140 through orifices in the secondary gas ring 160. Any suitable gas ring may be used as the secondary gas ring 160. The secondary gas ring 160 may be located above the gas ring 170, separated therefrom by an optional spacer 165 formed formed of aluminum or anodized aluminum, as shown in FIG. 2a. Alternatively, although not shown, the secondary gas ring 160 may be located below the gas ring 170, between the gas ring 170 and the substrate 120. Yet another alternative is that the Ar and $O_2$ may be supplied through orifices in a gas ring 162 connected to the chamber floor, as shown in FIG. 2b, with the spacer 165 separating the dielectric window 155 and the primary gas ring 170. Gas is supplied to the gas rings 160 and 170 via plenums 160a, 170a from suitable gas delivery ports connected to one or more gas sources (not shown).

The gas supply can further include a plurality of detachable injector tubes 180 connected to the primary gas ring 170 to direct at least some of a process gas such as $SiH_4$ or a related silicon-containing deposition gas such as $SiF_4$, TEOS, and so on, onto the substrate 120. These gases are delivered to the substrate from the injectors 180 through injector exit orifices 187. Additionally, reactant gases may be delivered through orifices in the primary gas ring 170. The injectors may be made of any suitable material such as aluminum, anodized aluminum, quartz or ceramics such as $Al_2O_3$. Process gas is supplied to these injectors from a gas source via the plenum 170*a*. Although two injectors are shown in FIGS. 2*a* and 2*b*, any number of injectors may be used. For example, an injector may be connected to each of the orifices on the primary gas ring 170. Preferably, eight to thirty-two injectors are employed on a 200 to 210 mm diameter ring 170 for a 200 mm substrate. The injectors 180 are located above the plane of the substrate 120, with their orifices at any suitable distance such as, for example, three to ten centimeters from the substrate.

The injectors may, according to this embodiment, be spaced inside, near or outside of the substrate periphery, for example zero to five centimeters or more from the substrate periphery. This helps to ensure that any potential particle flakes from the injectors will not fall onto the substrate and contaminate it. The injectors may all be the same length or alternatively a combination of different lengths can be used to enhance the deposition rate and uniformity. The injectors are oriented such that at least some of the injectors direct the process gas in a direction which intersects the exposed surface of the substrate.

The injectors according to one embodiment of the first aspect of the present invention are oriented to inject process gas in a direction which intersects an exposed surface of the substrate at an acute angle. The angle or axis of injection may range from about 15 to <90 degrees, preferably 15 to 45 degrees from the horizontal plane of the substrate. The angle or axis of injection may be parallel to the axis of the injector or, alternatively, at an angle of up to 90 degrees with respect to the axis of the injector. The exit orifice diameter of the injectors may be between 0.010 and 0.060 inches, preferably about 0.020 to 0.040 inches. The hollow core of the injectors 180 may be drilled to about twice the diameter of the exit orifices 187 to ensure that sonic flow occurs at the exit orifice and not within the core of the injector. The flow rate of $SiH_4$ is preferably between 25–300 sccm for a 200 mm substrate but could be higher for larger substrates.

Due to the small orifice size and number of injectors and large flowrates of $SiH_4$, a large pressure differential can develop between the gas ring 170 and the chamber interior. For example, with the gas ring at a pressure of >1 Torr, and the chamber interior at a pressure of about 10 mTorr, the pressure differential is about 100:1. This results in choked, sonic flow at the orifices of the injectors. The interior orifice of the injector may also be contoured to provide supersonic flow at the outlet.

Injecting the $SiH_4$ at sonic velocity inhibits the plasma from penetrating the injectors. This design prevents plasma-induced decomposition of the $SiH_4$ and the subsequent formation of amorphous silicon residues within the gas ring and injector extension tubes.

According to this embodiment, a combination of convective and radiative cooling may be used to limit the chamber wall and gas ring temperatures to preferably less than about 100° C. during processing. Alternatively, circulating fluid, preferably at −20 to 100° C., within the chamber walls may be used to control the wall and gas ring temperatures. When the gas ring temperature is maintained below 100° C., thermal decomposition of $SiH_4$ is not observed within the gas ring. In addition, because the gas ring is effectively an electrically grounded, enclosed metal chamber, no significant electric fields are present within the gas ring, which prevents plasma formation within the ring.

The plasma processing system according to this embodiment provides an increased deposition rate and improved uniformity on the substrate, compared to conventional gas distribution systems, by concentrating the silicon-containing process gas above the substrate and by preferentially directing the process gas onto specific regions of the substrate. The following discussion describes experimental data which illustrate the improved capability of the plasma processing system according to the present invention and also briefly describes the relevant theoretical background.

Figure 3A:
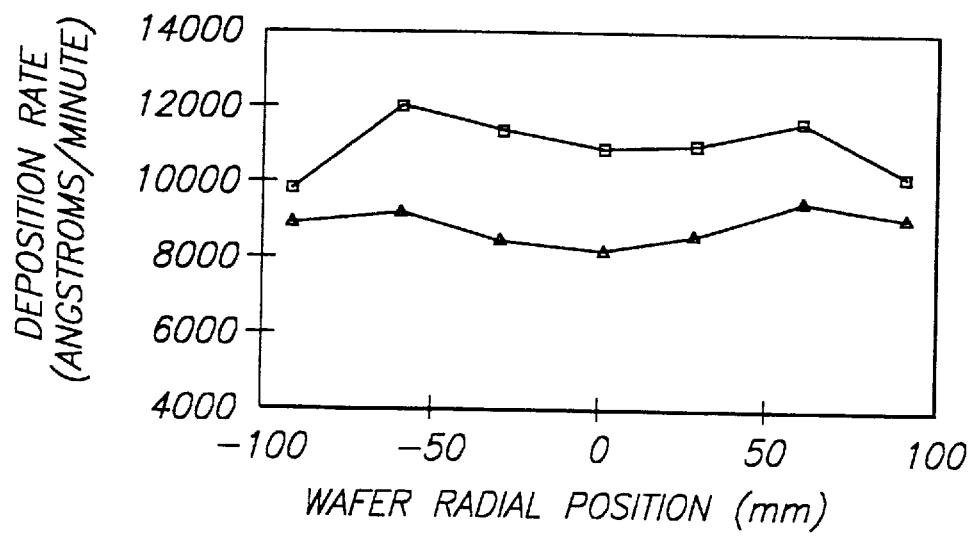
FIGS. 3a and 3b show experimental data illustrating the effects of varying the radial location of injectors and the direction of injection, respectively, in the plasma processing system illustrated in FIGS. 2a and 2b.

FIG. 3*a* illustrates two exemplary $SiO_2$ deposition profiles for a plasma processing system in which the gas injectors are located at different positions with respect to the substrate. Both of these cases were obtained at the same deposition conditions (plasma source power=2000 Watts, electrode bias power=2000 Watts, $SiH_4$ flow=180 sccm, $O_2$ flow=300 sccm, pressure=12 mTorr, 22.5 degrees downward injection angle with respect to the substrate plane) with a non-optimized primary gas ring 170. Case 1 (open boxes) shows experimental data where the (16 circumferential, equally spaced) injector 180 orifices were located about 0.5 cm outside of the substrate periphery, while case 2 (open triangles) shows experimental data where the injector orifices 187 were located about 2 centimeters outside of the substrate periphery. In both of these examples, the injector orifices 187 were located about 5 centimeters above the substrate 120. Generally speaking, in the plasma processing system according to the present invention, as long as the vertical location of the injector orifices 187 is a few centimeters or more above the substrate 120, the radial location of the injector orifices has a much larger impact on the deposition rate than does the vertical location.

In case 1, the overall deposition rate is higher, that is 10800 Angstroms/minute compared to 9200 Angstroms/minute for case 2. This is because in case 1, the silicon containing process gas is more concentrated over the center of the substrate. However, this increased deposition rate for case 1 comes at the expense of a decreased uniformity, which is 8.1% (1σ) for case 1 compared to 4.1% for case 2. By concentrating more of the silicon containing process gas onto and above the center of the substrate, the deposition rate on the outer (radial) region of the substrate is not increased in the same proportion as the deposition rate in the center. On the other hand, by positioning the injector orifices 187 further outward, the overall deposition rate is reduced, but the uniformity is improved. Hence, for a constant angle of injection (in this case 22.5 degrees) with respect to the substrate, there is a trade-off between deposition rate and uniformity, which occurs as the radial position of the injection point is varied.

The direction of injection from the gas ring 170 can, however, be optimized for each injector, so as to preferentially direct the process gas onto specific regions of the substrate. For example, in optimizing gas ring 170 for case 1, the angle of injection could be adjusted to preferentially direct more silicon-containing gas onto the substrate surface just inside of the substrate periphery. This would lead to an increase in the local deposition rate on the substrate and thereby improve the uniformity.

Figure 3B:
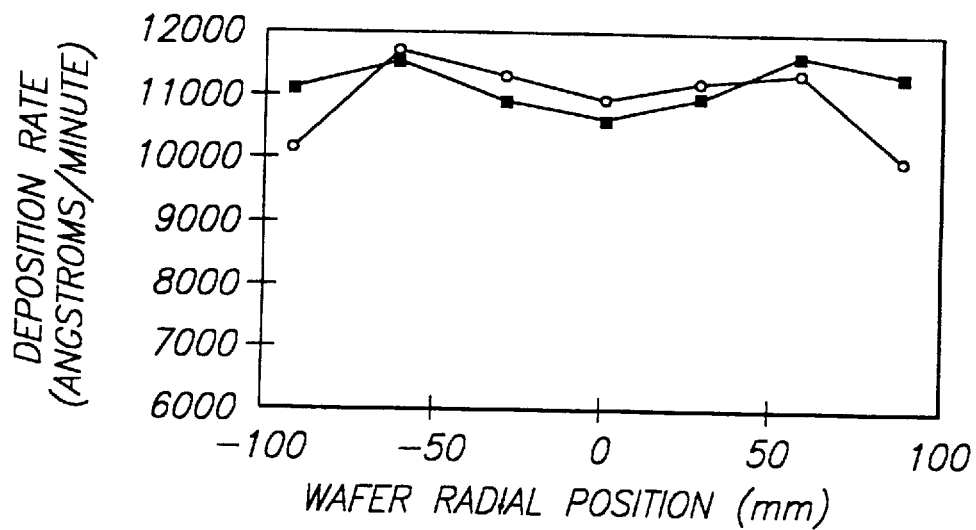

FIG. 3*b* shows experimental data which illustrate the capability for optimizing the deposition rate and uniformity of the plasma processing system according to the present invention by selecting the appropriate angle of injection for a given injection location. Both cases illustrated in FIG. 3b were obtained at the same conditions (plasma source power= 2500 Watts, electrode bias power=2000 W, SiH$_4$ flow=250 sccm, O$_2$ flow=350 sccm, pressure=14 mTorr) with identical injection locations (16 injectors, equally spaced circumferentially, approximately 2 centimeters outside of and approximately 6 centimeters above the substrate), using gas ring 170. In case 3, (open circles) the angle of injection was 0 degrees (parallel to the substrate), while in case 4 (solid squares) the angle of injection was 30 degrees downward (toward the substrate). For case 3, the deposition rate was 10800 Angstroms/minute, while the uniformity was 5.3%, with the deposition rate lowest near the substrate periphery. Similar to the results shown in FIG. 3b, the uniformity of case 3 could be improved by moving the injection location more outside of the substrate. This, however, would also result in a substantially decreased deposition rate (in FIG. 3a, the uniformity was approximately doubled, but with a 15% loss in deposition rate). By adjusting the injection angle to 30 degrees downward, as in case 4, the deposition onto the outer region of the substrate is increased, and the uniformity is improved to 2.5% while maintaining approximately the same overall deposition rate.

This example has demonstrated an unexpected result provided by the plasma processing system according to the present invention of improved deposition uniformity without a loss in deposition rate. This can be used to great advantage to increase the substrate throughput during semiconductor processing.

The plasma processing system according to this embodiment provides uniform, directed, rather than diffusive, flux of SiH$_4$ onto a substrate under typical HDPCVD conditions. Accordingly, consistent deposition uniformities with 1σ<3% are produced in most cases. This is accomplished by carefully superposing the individual injector sprays so that the sum of the injector fluxes at each point on the substrate are nearly equal.

The theoretical basis for increasing the deposition rate near the substrate periphery without significantly reducing the rate near the center of the substrate can be understood from the following discussion. Typically, free jet expansions from sonic nozzles occur in the continuum flow limit, which results in restricted expansions due to the formation of a barrel shock/Mach disk structure. With such restricted expansions, one would not expect to be able to achieve a uniform flux distribution over the substrate, with a relatively small number of injectors. According to the present invention, however, the density of the jet and the chamber ambient are so low that the jet rapidly transitions to the free molecular flow regime.

Figure 4:
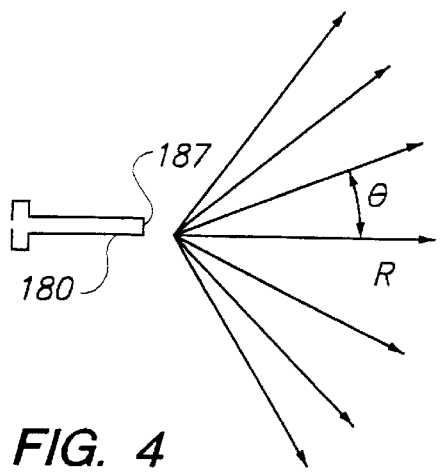
FIG. 4 illustrates exemplary flow streamlines of gas into the plasma processing system according to the first aspect of the present invention.

In the free molecular flow regime, the jet is so rarefied that a shock structure cannot be established, and the jet simply expands as a Prandtl-Meyer expansion, with an effectively frozen (constant) temperature and velocity. FIG. 4 illustrates exemplary flow streamlines of the gas jet from an injector. Referring to FIG. 4, in the expansion, the flow streamlines appear to radiate from a point source. The density decreases along each streamline in proportion to the inverse square of the distance from the source, and the variation of density from streamline to streamline (with polar angle θ) is approximately independent of the polar coordinate R. Thus, for example, at an exemplary flow rate of 200 sccm SiH$_4$ from 16 injectors having 0.020 inch diameter orifices, a chamber pressure of 10 mTorr and a gas ring pressure of 3.9 Torr, the total included angle of the conical expansion is approximately 150 degrees. This expansion is less divergent and thus more collimated than the cosine distribution associated with a purely effusive flow.

The centerline density decreases as the square of the distance from the jet exit. That is, the local gas density ρ is given as:

$$\rho(R,\theta=0) \alpha (\rho(R=0,\theta=0))/R^2 \qquad (1)$$

where R and θ are polar coordinates centered at the jet exit, with θ=0 defined as the jet axis. In addition, the density for such an expansion decreases with a cos$^2$θ dependence, that is:

$$\rho(R,\theta)=\rho(R,\theta)\cos^2(\pi\theta/2\phi) \qquad (2)$$

where φ is an empirical constant which depends upon the specific heat ratio for the injected gas. For example, φ=1.66 for nitrogen. By combining equation 1 and equation 2 and realizing that the velocity is constant beyond a few jet diameters, the flux J is determined as a function of position within the expansion as:

$$J_{SiH4}(R,\theta)=\text{constant}\cdot\rho(R,\theta) \qquad (3)$$

where J$_{SiH4}$ is the flux of SiH$_4$.

Figure 5:
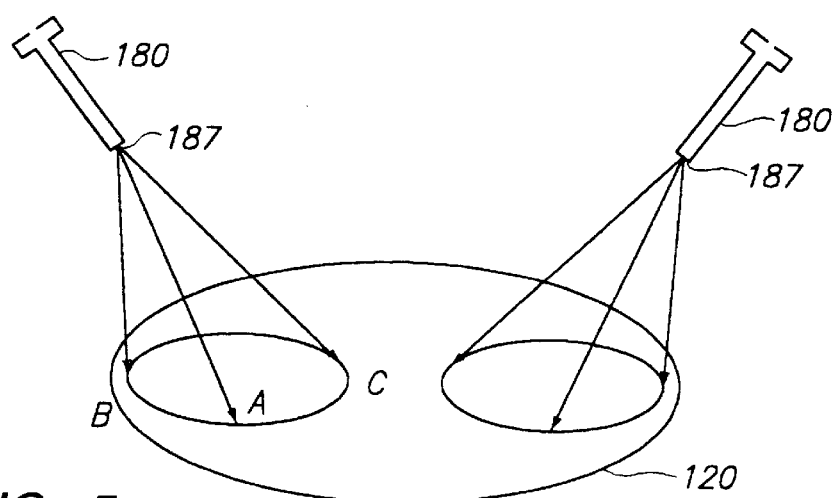
FIG. 5 illustrates qualitatively exemplary directions of a gas directed onto a substrate according to the first aspect of the present invention.

FIG. 5 illustrates qualitatively how a uniform SiH$_4$ flux may be directed onto the substrate. Referring to FIG. 5, assume the flux impinging on the substrate at a point A along a jet centerline is the desired flux. At an off-axis point, B, the radial distance from the axis to the jet is reduced while the streamline angle with respect to the jet centerline is increased. The flux dependence on R and θ are therefore complementary, and result in a largely uniform flux. That is, the decreased radial distance acts to increase the jet flux, while the increased streamline angle θ acts to decrease the flux. At an off-axis point C, both the radial position and the streamline angle are increased with respect to point A. This results in a reduced flux at the substrate center from this injector, but this can be compensated for by overlapping spray cones from the other, e.g., 15, injectors around the periphery of the substrate. Similar observations can be made for other points on the substrate. The uniformity is further enhanced because of the large conical expansion of each jet.

The simplified analysis described above does not take into account gas phase collisions. With a mean free path on the order of 1 cm, several gas phase collisions may be expected to occur prior to the SiH$_4$ molecules reaching the substrate. These collisions act to scatter the directed flux of SiH$_4$ somewhat, but the jets still maintain a far more directed nature than a purely diffusional source. It is this directional rather than diffusive nature of the plasma processing system according to the present invention that leads to the locally enhanced deposition rate.

Figure 6:
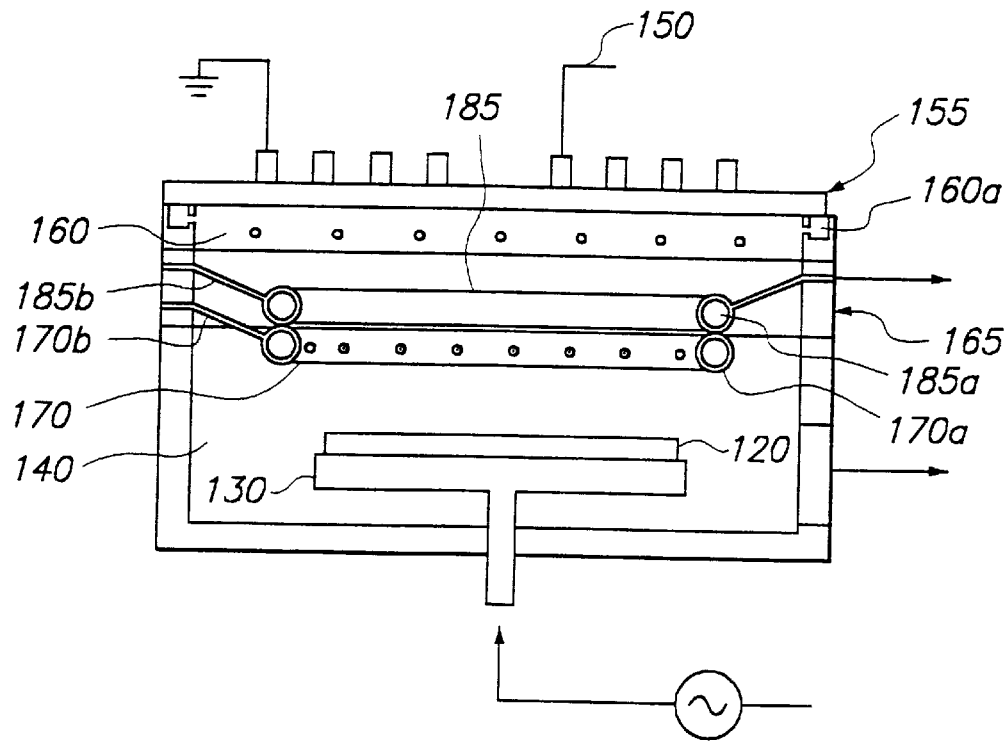
FIGS. 6 and 7 illustrate plasma processing systems according to exemplary embodiments of the first aspect of the present invention.

FIG. 6 illustrates a plasma processing system according to a second embodiment of the first aspect of the present invention. The plasma processing system illustrated in FIG. 6 is similar to that shown in FIG. 2a, except that the primary ring 170 in FIG. 6 is cantilevered and water-cooled. According to this embodiment, reactant gas is delivered through orifices in the gas ring 170 which may be oriented in any direction. Preferably, some of the orifices are directed towards the substrate to enhance the deposition rate.

The water cooling of the gas ring 170 may be accomplished by using two independent welded tubes (i.e., tube 170 and water cooled tube 185) as shown in FIG. 6 or by using a dual tube structure. Alternatively, a water cooling tube (not shown) may be spirally wrapped around the gas ring 170. The water cooling of gas ring 170 can be achieved by supplying water through inlet 185b to plenum 185a of tube 185. The water cooling provides thermal control to minimize flaking from the gas ring and also prevents excessive heating of the gas ring due to high density plasma exposure. Additionally, radiative cooling may be used to limit the chamber wall and gas ring temperatures and prevent thermal decomposition.

Figure 7:
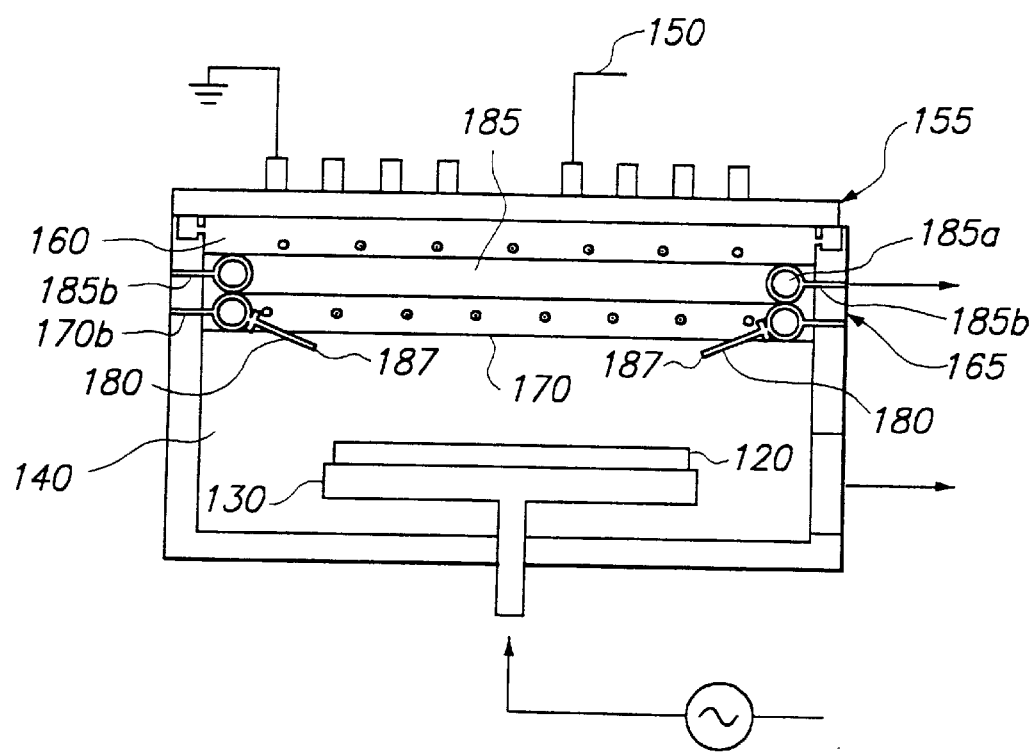

FIG. 7 illustrates a plasma processing system according to a third embodiment of the first aspect of the present invention. Referring to FIG. 7, the plasma processing system may include a cantilevered water-cooled gas ring 170 and injectors 180. The gas ring 170 may also be supported from the chamber floor.

According to this embodiment, reactant gases may be injected toward the substrate in the same manner as described above with regard to the first embodiment. Radiative cooling may be used to limit the chamber wall and gas ring temperatures. Additionally, the lower gas ring may be water-cooled as described above with regard to the second embodiment. Thus, the third embodiment provides uniform, directed deposition onto a substrate as well as thermal control of the gas injection hardware to minimize flaking.

Figure 8A:
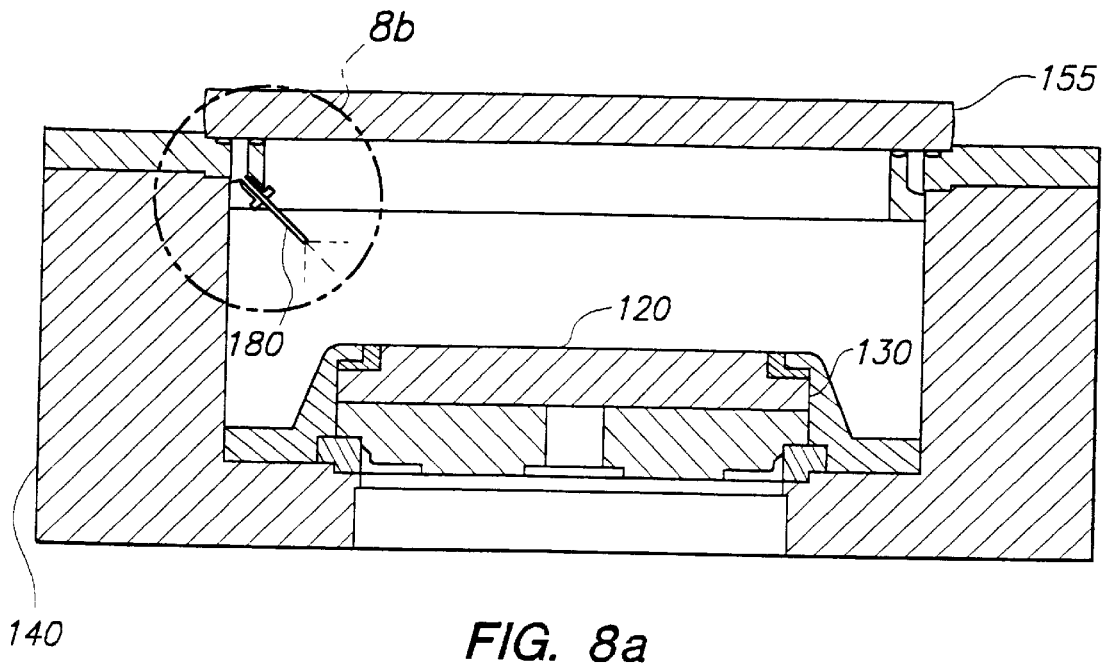
FIGS. 8a–8d illustrate detailed views of exemplary injectors in a plasma processing system according to the first aspect of the present invention.
Figure 8B:
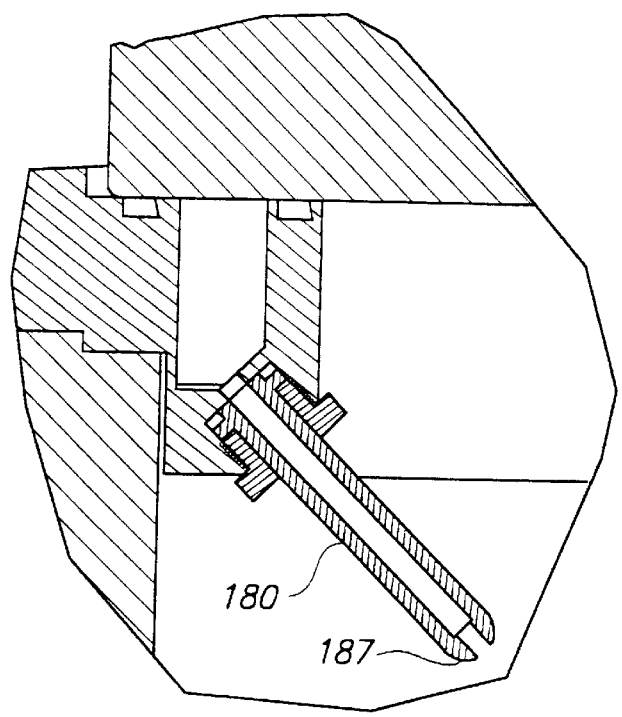
Figure 8C:
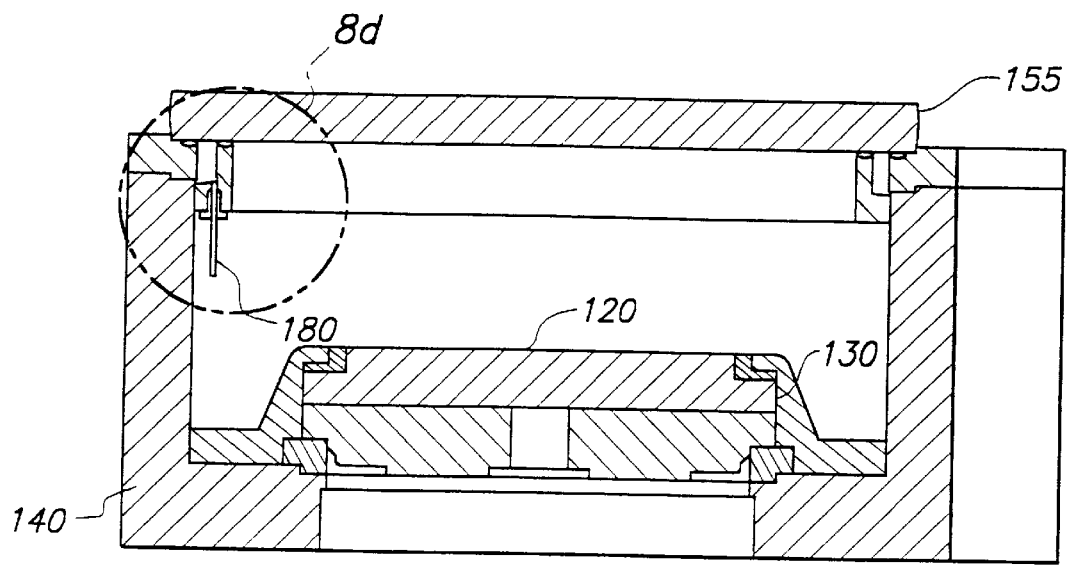

FIGS. 8a–8d illustrate detailed views of exemplary injectors in a plasma processing system according to the first aspect of the present invention. For simplicity of illustration, some elements of the plasma processing system, such as the antenna 150 and the gas rings 160 and 170, are not shown. FIGS. 8a and 8c depict examples of orientations of the injector 180 with respect to the substrate 120. FIG. 8a shows the injector 180 oriented approximately 45 degrees from the horizontal plane of the substrate 120. FIG. 8c shows an alternative but less optimal orientation of the injector 180 at 90 degrees from the horizontal plane of the substrate 120. Although not shown, preferably the axis of injection (i.e., gas flow direction) is 15 to 45 degrees from the horizontal plane of the substrate 120.

Figure 8D:
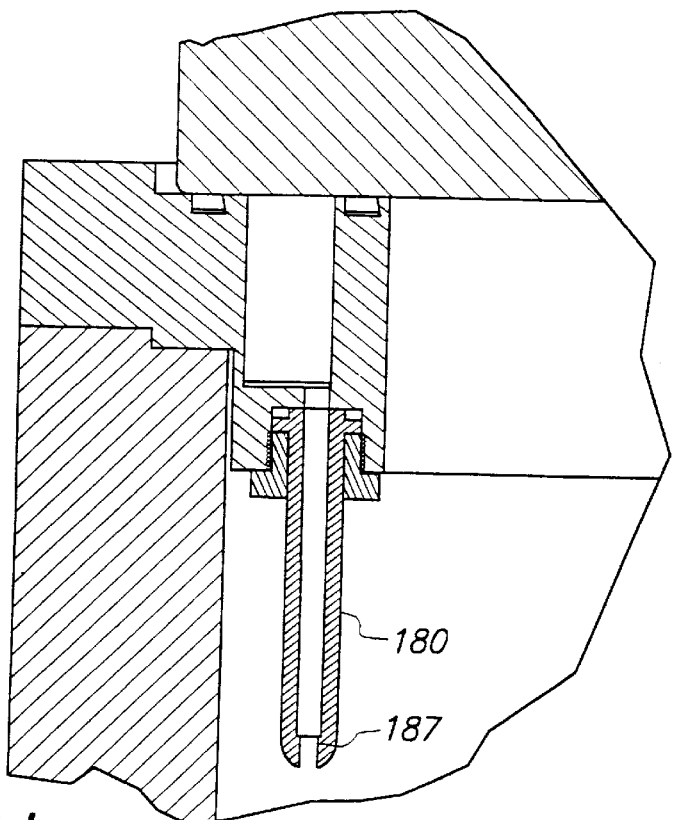

FIGS. 8b and 8d illustrate in detail the injector 180 shown in FIGS. 8a and 8c, respectively. As illustrated in FIGS. 8b and 8d, the core of the injector is larger than the diameter of the exit orifice 187 of the injector. This ensures that sonic flow occurs at the exit orifice and not within the core of the injector.

Figure 9A:
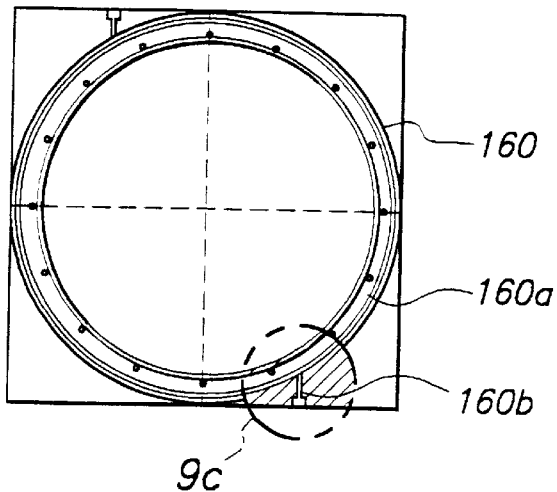
FIGS. 9a–9c and 10a–10b illustrate detailed views of exemplary gas rings according to the first aspect of the present invention.
Figure 9B:
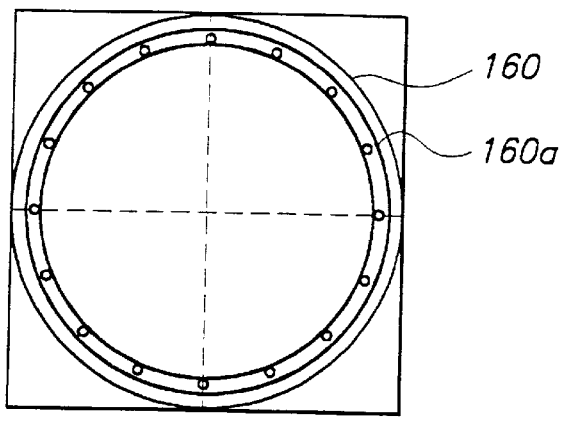
Figure 9C:
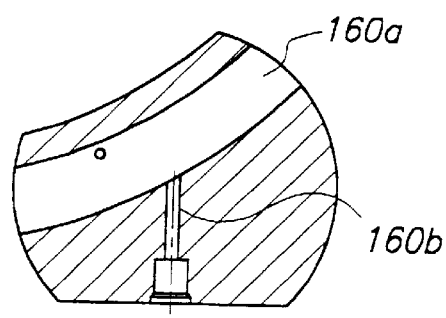
Figure 10A:
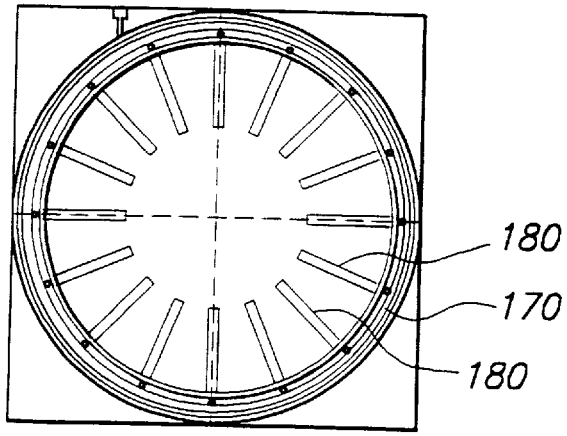
Figure 10B:
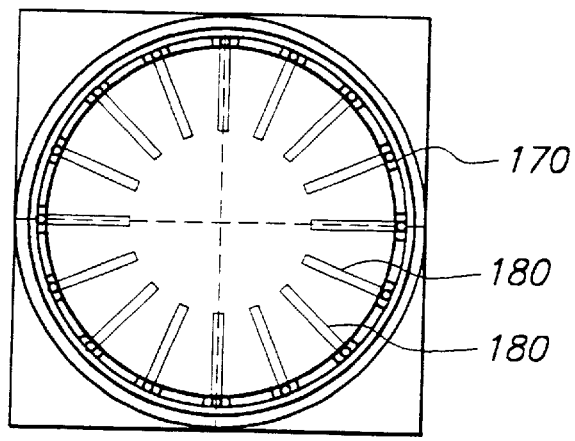

FIGS. 9a–9c and 10a–10b illustrate detailed views of exemplary gas rings according to the first aspect of the present invention. FIG. 9a illustrates a top view of the gas ring 160 and FIG. 9b illustrates a bottom view of the gas ring 160. FIG. 9c illustrates a detailed top view of the gas delivery port 160b and plenum 160a of the gas ring. Similarly, FIGS. 10a and 10b illustrate a top view and a bottom view, respectively, of the gas ring 170 and the injectors 180.

Figure 11:
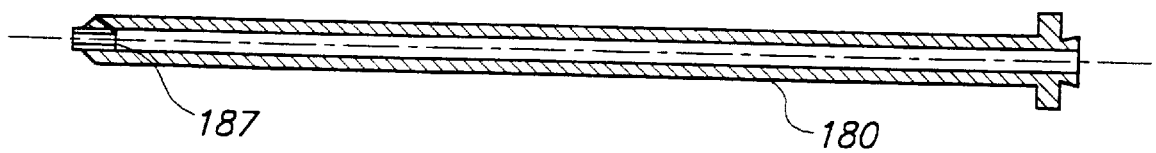
FIG. 11 illustrates a detailed view of an exemplary injector according to the first aspect of the present invention.

FIG. 11 illustrates a detailed view of an exemplary injector tube according to the first aspect of the present invention. The injector tube may have any suitable dimensions such as a length of, for example, ½ to 4 inches, an outer diameter of 0.15 to 0.3 inch, an inner diameter of 0.05 to 0.15 inch, an outlet orifice of 0.01 to 0.03 inch and a mounting flange of about 0.35 inch diameter by 0.05 inch thickness spaced about 0.05 inch from the proximal end of the injector. In an embodiment to be described later, the outlet orifice can be spaced 0.01 inch or more from the distal tip of the injector and the orifice can be oriented at an angle of 0 to 90 degrees with respect to the longitudinal axis of the injector. As in FIGS. 8b and 8d, it is apparent from FIG. 11 that the inner diameter of the injector tube 180 is larger than the diameter of the exit orifice 187 of the injector. This ensures that sonic flow occurs at the exit orifice and not within the core of the injector. The injector tube according to the first aspect of the present invention may have any desired dimensions which may be selected depending on the service requirements of the injector tube.

According to the first aspect of the present invention described above, gas is injected from the distal ends of the injectors, at least some of the gas directed toward the surface of the substrate. However, a problem associated with injecting gas from the distal end of an injector is that this may lead to clogging of the orifice, due to deposition of byproducts from reactant process gas on the distal end. This can be seen with reference to FIGS. 12a–b.

Figure 12A:
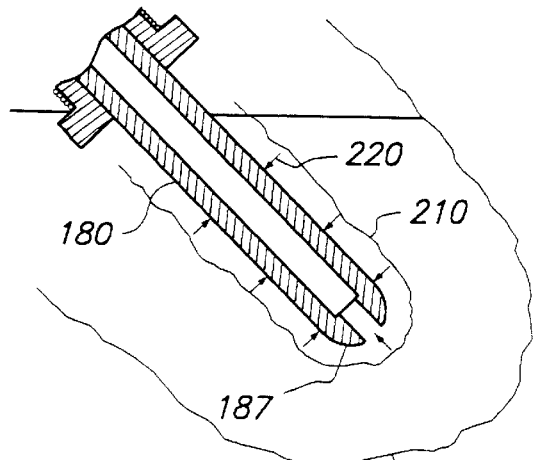
FIGS. 12a–12b illustrate a problem of clogged orifices.
Figure 12B:
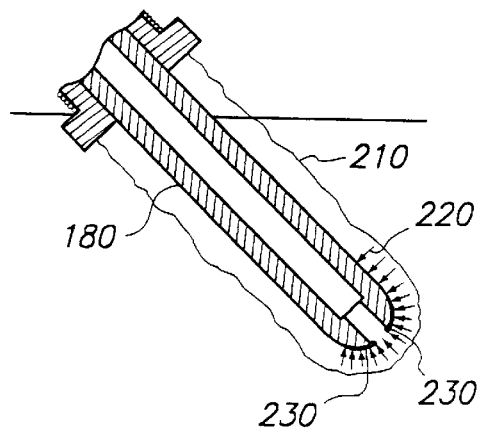

Referring to FIG. 12a, the plasma 200 generated by exciting the process gas is an electrically conductive gas which floats at an elevated electrical potential, i.e., the plasma potential. The plasma potential is largely determined by the capacitive coupling between the plasma 200 and the RF-driven substrate electrode 130. Under typical conditions, the plasma potential can reach hundreds of volts. The injector 180 generally remains at a lower potential (e.g., ground potential for a metallic injector) than the plasma. As shown in FIG. 12b, a thin sheath 210 forms around the "plasma immersed" portion of the injector 180, and electric field lines 220 are created by the difference in potential between the plasma 200 and the grounded injector 180. The resulting electric field lines 220 are perpendicular to the sheath 210. These electric fields can be very large as a result of bias power (applied by the substrate support) causing the plasma potential to oscillate with hundreds of volts of magnitude due to capacitive coupling with the RF powered substrate support.

It is well known that external structural corners and edges, whether sharp or radiused, act to focus electric fields (ee, for example, *Classical Electrodynamics*, by John David Jackson, John Wiley & Sons, New York, 1975, 2nd ed.). Regions with high electric fields within a plasma processor lead to enhanced gas dissociation. As shown in FIG. 12b, the tip of the injector 180 acts to focus the local electric field, so that the electric field lines are concentrated around the tip. In the figure, the electric field concentration is illustrated by the number of arrows. With the injection orifice 187 located at the distal end of the injector 180, the gas is injected in the region with the highest local electric fields, which leads to enhanced local dissociation and subsequent deposition 230 on the injector tip. Over time, the deposition 230 can clog the orifice 187, which can adversely affect process uniformity.

According to a second aspect of the invention, the problem of clogging is solved by locating the orifice away from the distal end of the injector. This design retains the feature that the process gas is injected above the substrate to provide high deposition/etching rates and uniformity, and further provides the advantage of reduced susceptibility to orifice clogging. Furthermore, the clogging can be reduced by locating the orifice so that it is not exposed to redeposition of material sputtered from the substrate. The reduced potential of orifice clogging thus allows more substrates to be sequentially processed before injector cleaning is required, which ultimately improves the substrate processing throughput.

Figure 13A:
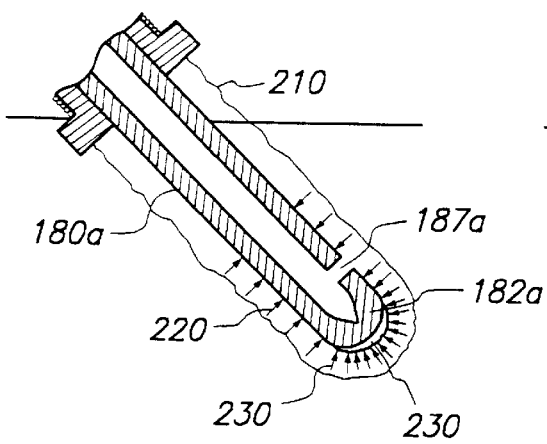
FIGS. 13a–13b illustrate how the problem of clogged orifices is solved according to a second aspect of the present invention.
Figure 13B:
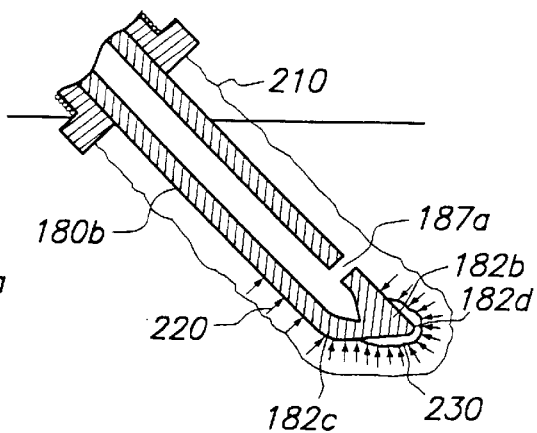

FIGS. 13a and 13b illustrate exemplary injectors according to a second aspect of the present invention. FIG. 13a illustrates an orifice 187A located along a longitudinal axis of an injector tube 180A, away from a rounded distal tip 182A of the injector. As can be seen from FIG. 13a, the deposition 230 is concentrated around the rounded tip 182A rather than around the orifice 187A. FIG. 13b illustrates an injector tube 180B with an orifice 187A located along its longitudinal axis, away from an angled tip 182B having an obtuse angled edge 182C and an acute angled edge 182D. As can be seen from FIG. 13b, the deposition 230 concentrates mostly on the acute angled edge 182D.

Figure 14A:
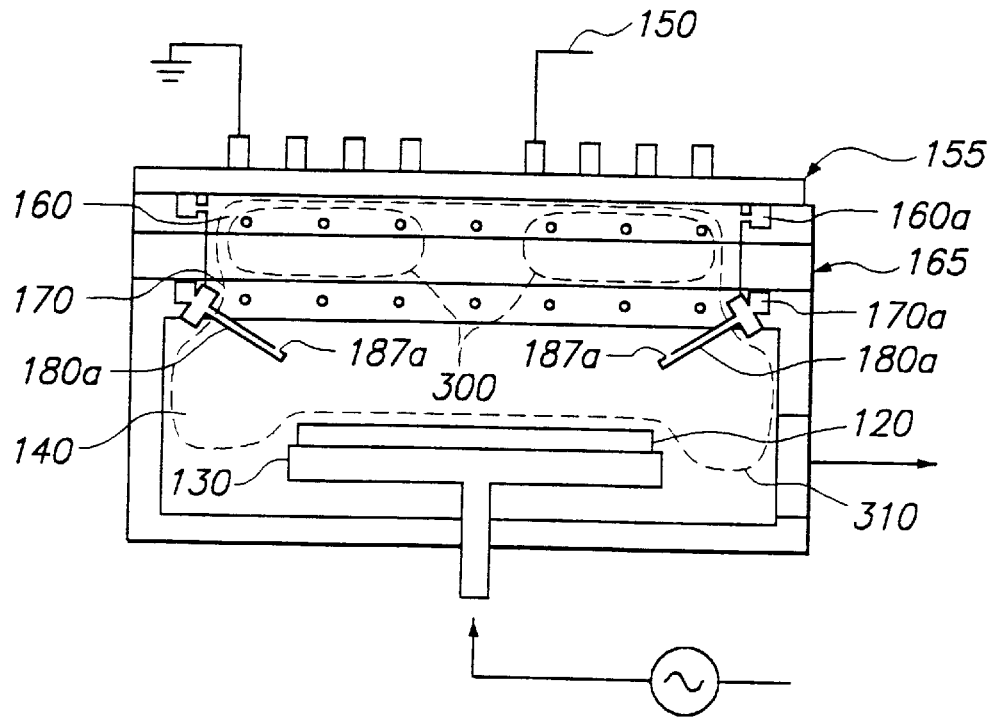
FIGS. 14a–14b illustrate an exemplary plasma processing system according to the second aspect of the present invention.
Figure 14B:
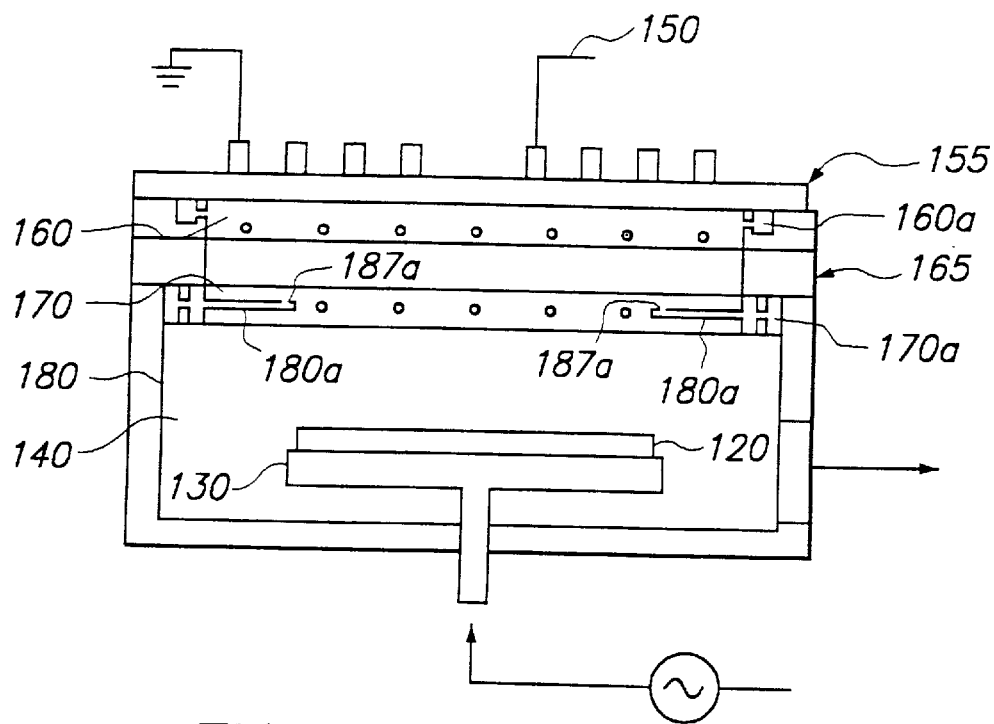

FIGS. 14a–14b illustrate exemplary plasma processing systems according to the second aspect of the present invention. As shown in FIG. 14a, the injectors 180A are located above the plane and/or outside the periphery of the substrate 120, with the orifices 187A at any suitable distance such as, for example, one to fifteen centimeters or more from the substrate depending on the orientation of the injector. Thus, gas can be injected at locations removed from the chamber wall to minimize film and polymer deposition on non-substrate surfaces such as chamber walls, etc. According to a preferred embodiment, the injectors 180A extend from the side wall of the processing chamber 140 up to but not inside the periphery of the substrate 120. Such an arrangement reduces the mapping of induced plasma non-uniformities onto the substrate.

As shown in FIG. 14a, the injectors are oriented such that at least some of the gas injected through the orifices is directed toward the primary plasma generation zone 300 (the region where the ionization is the highest) located within plasma boundary 310, between the dielectric window 155 and the substrate 120. This results in a potentially non-uniform distribution of feed gas reactants, but subsequent dissociation, diffusion, and convective mixing yield a uniform flux of chemical radicals and reactive intermediate species which contact the substrate surface.

In FIG. 14a, the injectors are oriented downward, toward the substrate surface. The orifices are located along the longitudinal axes of the injectors and are oriented to inject the gas toward the donut-shaped plasma generation zone 300. Alternately, the injectors can be oriented parallel to the surface of the substrate, as shown in FIG. 14b, or upward toward the chamber ceiling (not shown). Although not shown, the injectors can also be oriented in various other directions and positioned at other locations.

Figure 15A:
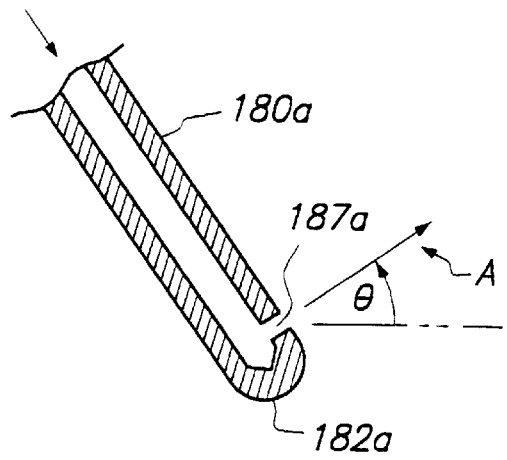
FIGS. 15a–15d illustrate exemplary injectors according to the second aspect of the present invention.
Figure 15B:
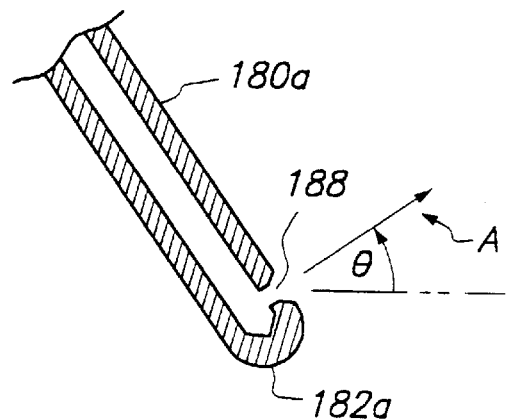
Figure 15C:
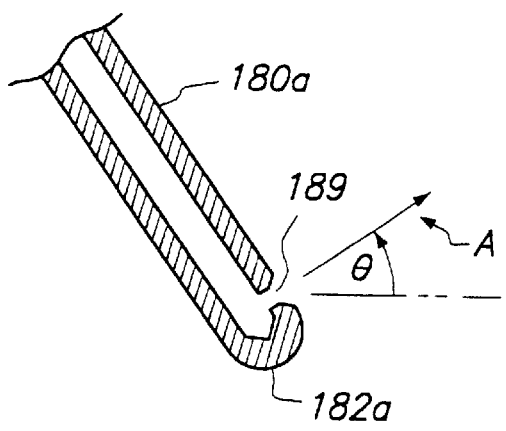

FIGS. 15a–15c illustrate detailed views of exemplary injectors in a plasma processing system according to the second aspect of the present invention. For simplicity of illustration, some elements of the plasma processing system are not shown.

As shown in FIG. 15a, the orifice 187A is oriented to introduce the process gas along an axis of injection (designated "A") in a direction pointing away from the substrate 120 and toward the primary plasma generation region. The exit orifice 187A has a uniform diameter along the length therefrom. Alternately, as shown in FIG. 15b, a stepped exit orifice 188 having an inner constant diameter portion and an outer expanding portion which is conically tapered or flared can be used. Another alternative is an exit orifice 189 having a diverging radiused contour as shown in FIG. 15c.

Figure 15D:
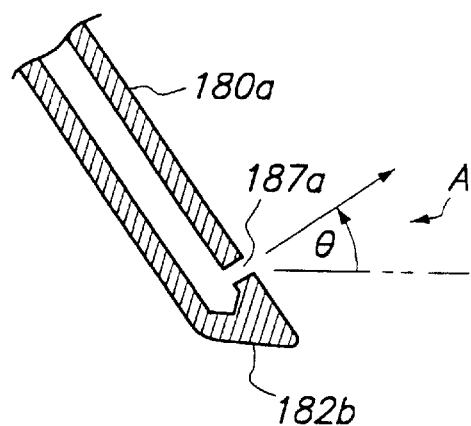

The injector 180A in FIGS. 15a–15c has a closed and rounded distal tip 182A. Alternately, the injector tip can have any desired configuration such as an injector 180B having an angled end 182B, as shown in FIG. 15d.

In the configurations shown in FIGS. 15a–15d, the axis or axes of injection may range from about 0 to 90 degrees, preferably about 10–80 degrees, and most preferably about 15 to 60 degrees from the horizontal plane of the substrate. Further, the angle of injection is preferably oriented such that the injected gas is distributed in a zone within an outer periphery of the substrate.

FIG. 16 illustrates a detailed view of an exemplary injector according to the second aspect of the present invention. Although three orifices 187A, 188, and 189 are shown along the longitudinal axis of the injector in FIG. 16, preferably only one orifice near the distal end of the injector 180A is used. However, any number of orifices can be provided. According to an exemplary embodiment, the distance "l" from the orifice 187A to the portion of the distal tip "E" at which the tip is rounded can range from 0.1 to 5 centimeters.

As illustrated in FIG. 16, the cross-sectional area of the core "C" of each injector 180A is preferably larger than the sum of the areas of exit orifices 187A, 188, and 189 of the injector. This ensures that sonic flow occurs at the exit orifice and not within the core of the injector. Preferably, the total area of all injector orifices is less than about half the cross-sectional area of the plenum 170a feeding the injectors. In addition, the total area of the orifices on a given injector is preferably less than about half the cross-sectional area of the core of the injector. This helps ensure that each orifice is supplied with process gas so that the process gas can be distributed evenly within the chamber. In an exemplary embodiment, the core C of the injector can range between 0.06 and 0.5 inch in diameter. The diameter of the exit orifices 187A, 188, and 189 can range between 0.01 and 0.125 inch, preferably between 0.02 and 0.06 inch.

According to this embodiment, by locating the injection orifices along the longitudinal axis of the injector, the orifices are less prone to clogging in plasma CVD and polymerizing halogen-based plasma etch applications. In addition, by locating the orifices away from the distal tip, the orifices are preferably shielded from redeposition of substrate sputtered material.

According to this embodiment, photoresist etch uniformity and selectivity to $SiO_2$ in oxide etch applications using halogen and halocarbon based chemistries are improved. Conventional injection through a showerhead incorporated in or below a dielectric window can result in nonuniform etching across the substrate, e.g., "center fast resist etching", which can lead to poor control of the etched features and profiles, and differences in features at the substrate center and edge. In addition, polymer formation on the TCP™ window or the showerhead can lead to undesirable particle flaking and contamination on the substrate. In contrast, edge injection via a gas injection ring can result in "edge fast etching" and polymer deposition on the chamber walls. Photoresist to oxide selectivities are typically only 1–4 in these cases, where 5–10 would be desirable. The embodiment of the invention utilizing injectors in combination with sidewall gas orifices can provide improvement in the uniformity of the resist etch rate (typically 6% 3σ) with simultaneous resist to oxide selectivities of 10 or more. The present preferred injection design thus appears to provide a much more uniform flux of reactive intermediates and chemical radicals to the substrate surface, including both etch species, such as atomic fluorine, and polymerizing species, such as CF, $CF_2$, and $CF_3$.

Figure 17:
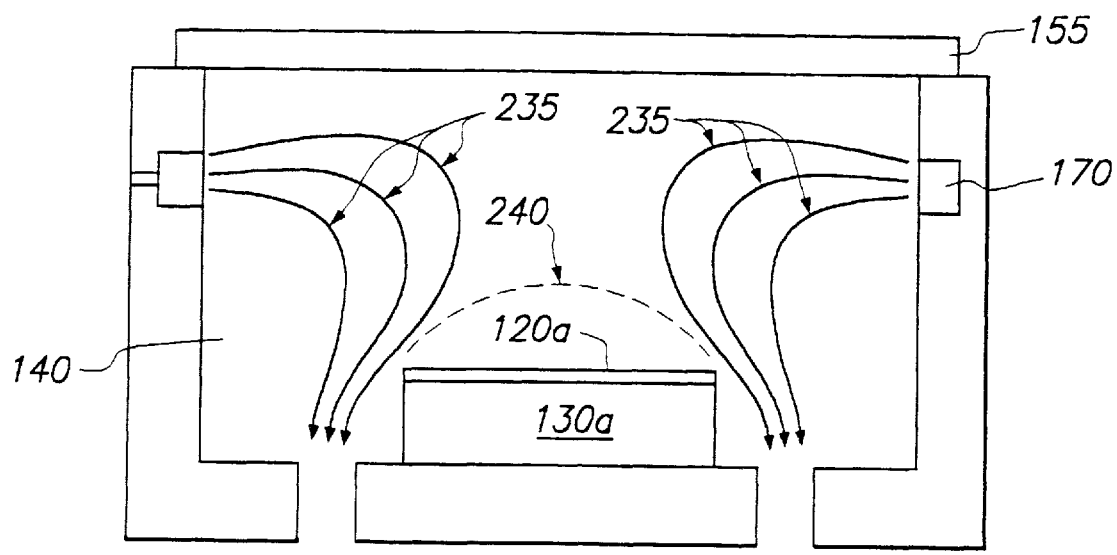
FIG. 17 illustrates the problem of by-product build up due to conventional showerhead distribution systems.

As the substrate size increases, so does the need for center fed gas. Injection systems supplying gas from injectors attached to the side walls of a processing chamber, such as those described above, may not provide adequate process gas delivery to the center of large area substrates typically encountered in flat panel processing. This is particularly true in bottom-pumped chamber designs commonly found in plasma processing systems. For example, as shown in FIG. 17, the process gas flows along the streamlines 235, from the orifices towards the bottom of the processing chamber. The streamlines 235 extend only partially over the substrate 120A supported on the substrate support 130A. In the case of plasma etching, without a means for center gas feed, etch by-products 240 may stagnate above the center of the substrate 120A, in which case transport is essentially through diffusion alone. This can lead to undesirable non-uniform etching across the substrate.

According to an alternative embodiment of the second aspect of the invention, process gas is injected within the plasma region facing and in close proximity to, the center of the substrate. For instance, a showerhead nozzle 250 is immersed within the plasma and mounted from the upper plasma boundary surface (e.g., the chamber ceiling), be it flat or curved dielectric window, bell jar or dome, a mechanical support structure, an upper electrode, or the like. The showerhead nozzle 250 is immersed within the plasma at a selectable distance so that the distance between its gas injection orifices and the substrate can be adjusted without changing the overall aspect ratio of the chamber, i.e., without changing the height of the ceiling with respect to the substrate. The aspect ratio of the chamber must be sufficient to allow adequate diffusion of the ions and neutral species in order to ensure a uniform etch or deposition rate. By incorporating center gas feed with injection orifices located close to the substrate, the convective transport out of the region above the substrate is improved as illustrated by streamlines 235A in FIG. 18.

Figure 18:
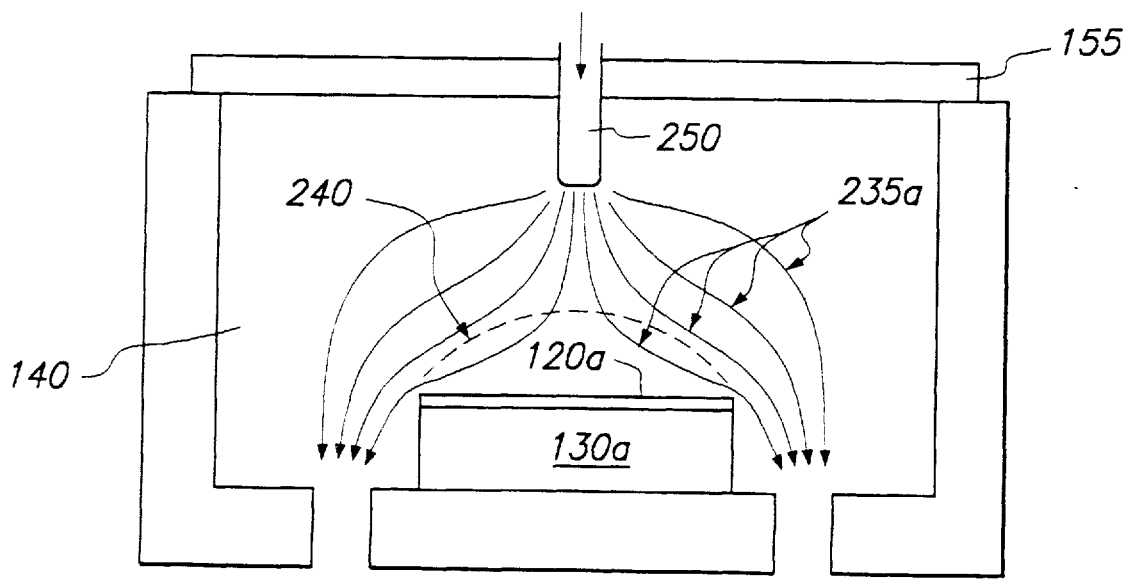
FIG. 18 illustrates another exemplary plasma processing system according to the second aspect of the present invention.

FIG. 18 illustrates a plasma processing system according to an alternative embodiment of the second aspect of the present invention. In FIG. 18, the plasma-immersed showerhead nozzle 250 may be an integral part of the chamber ceiling structure or may be vacuum sealed and mechanically removable. The showerhead nozzle 250 may be constructed from any suitable electrically conductive or dielectric material such as aluminum, anodized aluminum, or ceramic such as alumina, silicon nitride, silicon carbide, or quartz, or combinations thereof. If the nozzle 250 is attached to a dielectric window, bell jar or the like, the outer wall of the nozzle is preferably made of the same material or one with a similar thermal expansion coefficient as the component to which it is attached. This reduces particle contamination problems associated with differential thermal expansion between the nozzle and the component to which it is attached. In the case of a quartz window, the nozzle 250 may be fused to the window for ease of manufacture.

Although one or more shower head nozzles may be located anywhere on the chamber ceiling, preferably a single showerhead nozzle 250 is located at the center of the chamber ceiling. This positions the immersed nozzle in a region where the azimuthal electric field induced by the TCP™ coil falls to zero, which minimizes perturbations of the plasma generation zone. Furthermore, it is preferable that the nozzle 250 is immersed a suitable distance such as no more than about 80% of the distance between the chamber ceiling and the substrate. This ensures that the ion diffusion from upper regions of the chamber have sufficient space to fill in the lower ion density immediately beneath the showerhead nozzle. This will minimize any "shadow" of the nozzle in the ion flux to the substrate.

Using the immersed showerhead nozzle provides the means for independent selection of the center gas feed location and the chamber aspect ratio. This facilitates efficient utilization of process gas and improves process gas delivery to the central region of large area substrates with minimal disturbance to plasma uniformity. This configuration is also advantageous because locating the nozzle orifices close to the substrate increases the convective transport relative to diffusive transport in the region immediately above the substrate. In addition to improving the delivery of the reactants, the immersed showerhead facilitates efficient transport of etch by-products out of the substrate region, which can favorably impact etch uniformity and profile control, particularly in chemically driven applications such as aluminum etching.

FIGS. 19a and 19b illustrate exemplary showerhead nozzles according to the second aspect of the present invention. In FIGS. 19a and 19b, the showerhead nozzle 250 is inserted through the dielectric window (or chamber ceiling) 155, and chamber vacuum integrity is maintained by a vacuum sealant 157. The vacuum sealant 157 may comprise an O-ring seal, a bonding agent, or any other suitable sealant. As shown in FIGS. 19a and 19b, the showerhead nozzle 250 can include various orifices 252, 254, and 256 located at selective positions which are distant from points on the nozzle which experience electric field focusing, e.g., external corners or tips with sharp convex curvature. Preferably, the orifices are located along the longitudinal axis of the nozzle 250, but the orifices can be located on locally flat regions of, for example, a nozzle with a conical tip. As shown in FIG. 19b, a gas injection orifice 258 can also be located on the distal end of the flat axial end face of a cylindrical-shaped nozzle. The conical tip showerhead nozzle is desirable as it facilitates ion diffusion to the region immediately beneath the injector. By locating the injection orifices outside of regions with local electric field focusing, the potential of orifice clogging in polymerizing etch or deposition applications is reduced.

According to an exemplary embodiment, the injection orifices are small enough that the plasma sheath 210 formed around the nozzle is largely unaffected by the presence of the injector orifices. The total area of the orifices of the showerhead nozzle is preferably more than the cross-sectional area of the core C1 of the showerhead nozzle. This helps ensure that each orifice is uniformly supplied with process gas so that process gas can be delivered from each orifice so that process gas can be distributed evenly within the chamber. The injection to various regions above the substrate can be tailored by utilizing different diameters for the various injection orifices.

The orifices can have any desired shape such as the shapes shown in FIGS. 19a and 19b. Alternately, the orifices can have conically tapered or flared surfaces or be radially contoured. The orifices can be oriented to inject the gas in any direction, including directly at the substrate, at an acute angle with respect to the substrate, parallel to the substrate or back toward the upper plasma boundary surface (at an oblique angle with respect to the longitudinal axis of the nozzle), or combinations thereof. It is desired to achieve a uniform flux of chemical radicals and reactive intermediate species onto the substrate surface to facilitate uniform etch and deposition rates across the large area substrate. This may require additional gas injection means near the periphery of the substrate or from other chamber walls.

Figure 20:
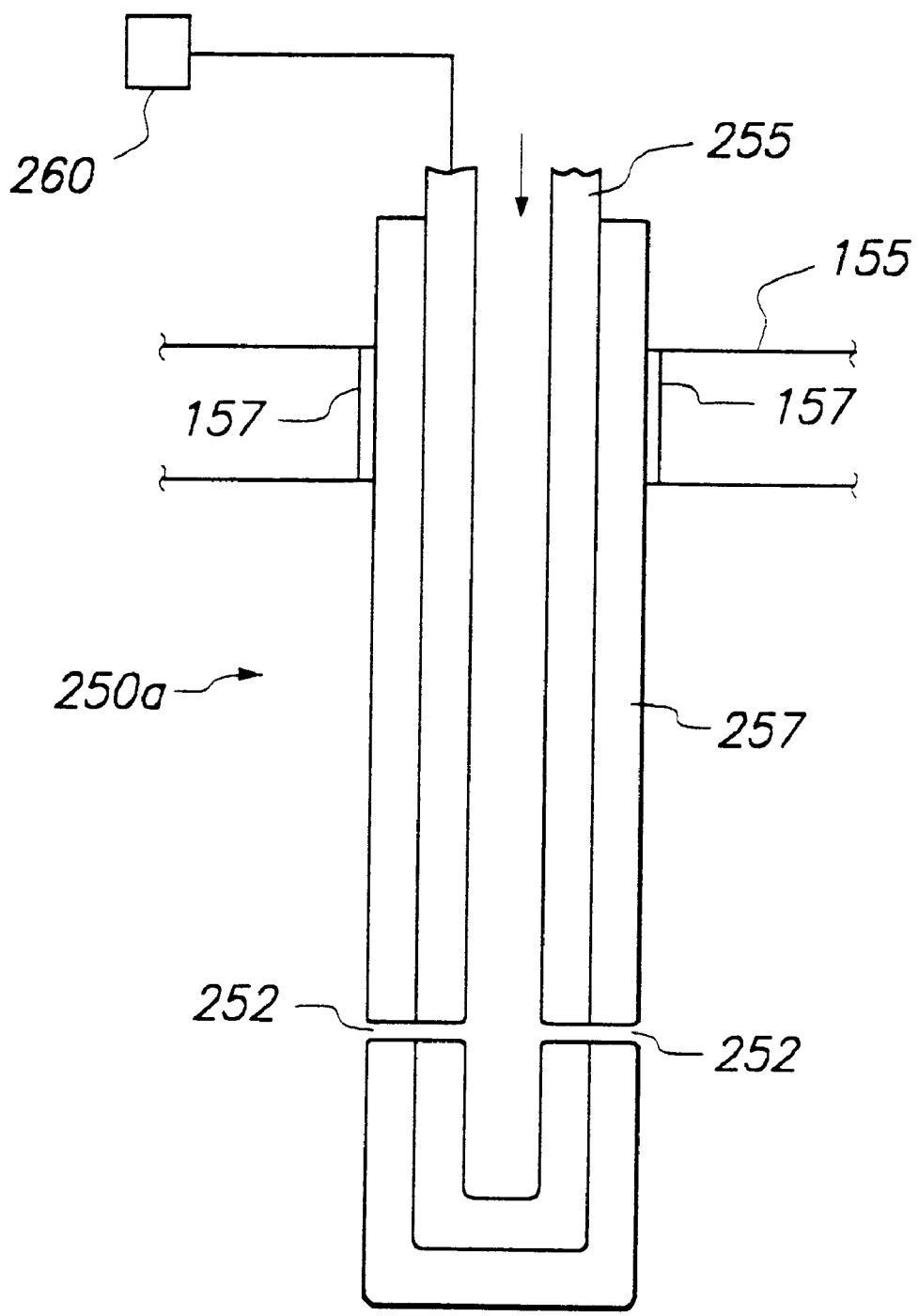
FIG. 20 illustrates a modified showerhead nozzle according to the second aspect of the present invention.

FIG. 20 illustrates a detailed diagram of an exemplary showerhead nozzle 250A. As shown in FIG. 20, the showerhead nozzle may be a composite coaxial structure comprising an inner metallic liner or sleeve 255 inserted into the interior of a dielectric tube 257. The metallic liner 255 may be electrically connected via suitable circuitry 260 to ground so that plasma formation within the liner is suppressed. Alternately, the circuitry can connect the metallic liner to a power source such as dc, ac, or RF power source to promote ion bombardment onto the outer dielectric surface of the nozzle, thereby suppressing polymer or film deposition on the immersed nozzle.

Preferably, no sharp corners exist at the distal end of the nozzle in order to reduce local electric field enhancement near the nozzle tip. However, there may be cases where such field enhancement can be advantageous.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A plasma processing system comprising:
   a plasma processing chamber;
   a substrate support supporting a substrate within the processing chamber;
   a dielectric member having an interior surface facing the substrate support, wherein the dielectric member forms a wall of the processing chamber;
   a gas supply including at least one elongated injector tube having a distal end thereof extending in the processing chamber and having one or more orifices in a sidewall thereof, the gas supply supplying process gas into the chamber; and
   an RF energy source which inductively couples RF energy through the dielectric member and into the chamber to energize the process gas into a plasma state to process the substrate.

2. The plasma processing system of claim 1, wherein an electric field is created around the injector tube in response to the energizing of the process gas, the electric field being concentrated at the distal end of the injector tube, and the orifices being spaced from the concentrated electric field.

3. The system of claim 1, wherein the system is a high density plasma chemical vapor deposition system or a high density plasma etching system.

4. The system of claim 1, wherein the RF energy source comprises an RF antenna and the injector tube injects the process gas toward a primary plasma generation zone in the chamber.

5. The system of claim 1, wherein the one or more orifices are spaced apart along a longitudinal axis of the injector tube and each orifice has a uniform or nonuniform cross section along the length thereof.

6. The system of claim 1, wherein a plurality of the injector tubes are distributed around the substrate periphery in a manner such that the injector tubes do not extend into a zone within the substrate periphery.

7. The system of claim 1, wherein the injector tube injects the process gas at a subsonic, sonic, or supersonic velocity.

8. The system of claim 1, wherein the injector tube comprises a showerhead nozzle having a plurality of orifices along a longitudinal axis thereof.

9. The system of claim 8, wherein the showerhead nozzle extends into a central region of the chamber.

10. The method of claim 8, wherein the nozzle includes an inner electrically conductive layer which is grounded or powered and an outer dielectric layer encapsulating the inner layer.

11. The system of claim 1, wherein the injector tube includes a closed distal end and the one or more orifices inject process gas at an acute angle relative to a plane parallel to an exposed surface of the substrate.

12. The system of claim 1, wherein the injector tube extends rectilinearly and includes a closed distal end, the process gas being injected from the injector tube in a direction which is not parallel to a longitudinal axis of the injector tube and the one or more orifices are spaced from the closed distal end.

13. The system of claim 1, wherein the injector tube comprises a showerhead nozzle supported by the dielectric member, the showerhead nozzle including at least one opening in a tapered, curved or flat distal end.

14. The system of claim 8, wherein the RF energy source comprises an RF antenna and the showerhead nozzle injects the process gas toward a primary plasma generation zone in the chamber.

15. The system of claim 8, wherein the showerhead nozzle injects the process gas at a subsonic, sonic, or supersonic velocity.

16. The system of claim 1, wherein the injector tube has a tapered, curved or flat distal end.

17. A method of plasma processing a substrate comprising:
    placing a substrate on a substrate support in a processing chamber, wherein an interior surface of a dielectric member forming a wall of the processing chamber faces the substrate support;
    supplying process gas into the processing chamber from a gas supply including at least one elongated injector tube having a distal end thereof extending in the processing chamber and having one or more orifices in a sidewall thereof; and
    energizing the process gas into a plasma state by inductively coupling RF energy produced by the RF energy source through the dielectric member into the processing chamber, the process gas being plasma phase reacted with an exposed surface of the substrate.

18. The method of claim 17, wherein an electric field is created around the injector tube in response to the energizing of the process gas, the electric field being concentrated at the distal end of the injector tube, and the orifices being spaced from the concentrated electric field.

19. The method of claim 17, wherein the RF energy source comprises an RF antenna and the injector tube injects the process gas toward a primary plasma generation zone in the chamber.

20. The method of claim 17, wherein the one or more orifices are spaced apart along a longitudinal axis of the injector tube and each orifice has a uniform or nonuniform cross section along the length thereof.

21. The method of claim 17, wherein a plurality of the injector tubes are distributed around the substrate periphery in a manner such that the injector tubes do not extend into a zone within the substrate periphery, the injector tubes injecting the process gas into the zone.

22. The method of claim 17, wherein the injector tube injects the process gas at a subsonic, sonic, or supersonic velocity.

23. The method of claim 17, wherein individual substrates are consecutively processed in the processing chamber by contacting the substrates with the plasma gas so as to deposit or etch a layer on each of the substrates.

24. The method of claim 17, wherein the injector tube comprises a showerhead nozzle having orifices spaced apart along a longitudinal axis thereof, the orifices injecting the process gas in a plurality of different directions.

25. The method of claim 24, wherein the showerhead nozzle extends into a central portion of the chamber and the orifices inject the process gas in a zone between the exposed surface of the substrate and the interior surface of the dielectric member.

26. The method of claim 24, wherein the showerhead nozzle includes an outer dielectric layer and an inner electrically conductive layer, the dielectric layer encapsulating the inner layer and the inner layer being electrically grounded or powered during the processing of the substrate.

27. The method of claim 17, wherein the injector tube extends rectilinearly and includes a closed distal end, the process gas being injected from the injector tube in a direction which is not parallel to a longitudinal axis of the injector tube and the one or more orifices are spaced from the closed distal end.

28. The method of claim 17, wherein the injector tube comprises a showerhead nozzle supported by the dielectric member, the showerhead nozzle including at least one opening in a tapered, curved or flat distal end.

29. The method of claim 17, wherein the injector tube has a tapered, curved or flat distal end.

* * * * *